United States Patent
Leschkies et al.

(10) Patent No.: US 12,388,049 B2
(45) Date of Patent: Aug. 12, 2025

(54) HIGH CONNECTIVITY DEVICE STACKING

(71) Applicant: Applied Materials, Inc., Santa Clara, CA (US)

(72) Inventors: Kurtis Leschkies, San Jose, CA (US); Han-Wen Chen, Cupertino, CA (US); Steven Verhaverbeke, San Francisco, CA (US); Giback Park, San Jose, CA (US); Kyuil Cho, Santa Clara, CA (US); Jeffrey L. Franklin, Albuquerque, NM (US); Wei-Sheng Lei, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/360,749

(22) Filed: Jul. 27, 2023

(65) Prior Publication Data

US 2024/0021582 A1    Jan. 18, 2024

Related U.S. Application Data

(62) Division of application No. 17/578,271, filed on Jan. 18, 2022, now Pat. No. 11,742,330, which is a
(Continued)

(51) Int. Cl.
*H01L 25/065* (2023.01)
*H01L 23/495* (2006.01)
(Continued)

(52) U.S. Cl.
CPC .... *H01L 25/0657* (2013.01); *H01L 23/49586* (2013.01); *H01L 23/5226* (2013.01); *H01L 25/50* (2013.01); *H05K 1/144* (2013.01)

(58) Field of Classification Search
CPC ............... H01L 25/0657; H01L 25/50; H01L 23/49586; H01L 23/5226; H05K 1/144; H10B 80/00
See application file for complete search history.

(56) References Cited

U.S. PATENT DOCUMENTS

| | | |
|---|---|---|
| 4,073,610 A | 2/1978 | Cox |
| 5,126,016 A | 6/1992 | Glenning et al. |

(Continued)

FOREIGN PATENT DOCUMENTS

| | | |
|---|---|---|
| CA | 2481616 C | 1/2013 |
| CN | 1646650 A | 7/2005 |

(Continued)

OTHER PUBLICATIONS

PCT International Search Report and Written Opinion dated Feb. 4, 2022, for International Application No. PCT/ US2021/053821.
(Continued)

*Primary Examiner* — Timor Karimy
(74) *Attorney, Agent, or Firm* — Patterson + Sheridan, LLP

(57) ABSTRACT

The present disclosure generally relates to stacked miniaturized electronic devices and methods of forming the same. More specifically, embodiments described herein relate to semiconductor device spacers and methods of forming the same. The semiconductor device spacers described herein may be utilized to form stacked semiconductor package assemblies, stacked PCB assemblies, and the like.

16 Claims, 15 Drawing Sheets

Related U.S. Application Data division of application No. 16/814,785, filed on Mar. 10, 2020, now Pat. No. 11,257,790.

(51) Int. Cl.
  *H01L 23/522* (2006.01)
  *H01L 25/00* (2006.01)
  *H05K 1/14* (2006.01)

(56) References Cited

U.S. PATENT DOCUMENTS

| | | |
|---|---|---|
| 5,268,194 A | 12/1993 | Kawakami et al. |
| 5,353,195 A | 10/1994 | Fillion et al. |
| 5,367,143 A | 11/1994 | White, Jr. |
| 5,374,788 A | 12/1994 | Endoh et al. |
| 5,474,834 A | 12/1995 | Tanahashi et al. |
| 5,670,262 A | 9/1997 | Dalman |
| 5,767,480 A | 6/1998 | Anglin et al. |
| 5,783,870 A | 7/1998 | Mostafazadeh et al. |
| 5,841,102 A | 11/1998 | Noddin |
| 5,878,485 A | 3/1999 | Wood et al. |
| 6,013,948 A | 1/2000 | Akram et al. |
| 6,039,889 A | 3/2000 | Zhang et al. |
| 6,087,719 A | 7/2000 | Tsunashima |
| 6,117,704 A | 9/2000 | Yamaguchi et al. |
| 6,211,485 B1 | 4/2001 | Burgess |
| 6,384,473 B1 | 5/2002 | Peterson et al. |
| 6,388,202 B1 | 5/2002 | Swirbel et al. |
| 6,388,207 B1 | 5/2002 | Figueroa et al. |
| 6,392,290 B1 | 5/2002 | Kasem et al. |
| 6,459,046 B1 | 10/2002 | Ochi et al. |
| 6,465,084 B1 | 10/2002 | Curcio et al. |
| 6,489,670 B1 | 12/2002 | Peterson et al. |
| 6,495,895 B1 | 12/2002 | Peterson et al. |
| 6,506,632 B1 | 1/2003 | Cheng et al. |
| 6,512,182 B2 | 1/2003 | Takeuchi et al. |
| 6,538,312 B1 | 3/2003 | Peterson et al. |
| 6,555,906 B2 | 4/2003 | Towle et al. |
| 6,576,869 B1 | 6/2003 | Gower et al. |
| 6,593,240 B1 | 7/2003 | Page |
| 6,631,558 B2 | 10/2003 | Burgess |
| 6,661,084 B1 | 12/2003 | Peterson et al. |
| 6,677,552 B1 | 1/2004 | Tulloch et al. |
| 6,713,719 B1 | 3/2004 | De Steur et al. |
| 6,724,638 B1 | 4/2004 | Inagaki et al. |
| 6,775,907 B1 | 8/2004 | Boyko et al. |
| 6,781,093 B2 | 8/2004 | Conlon et al. |
| 6,799,369 B2 | 10/2004 | Ochi et al. |
| 6,894,399 B2 | 5/2005 | Vu et al. |
| 7,028,400 B1 | 4/2006 | Hiner et al. |
| 7,062,845 B2 | 6/2006 | Burgess |
| 7,064,069 B2 | 6/2006 | Draney et al. |
| 7,078,788 B2 | 7/2006 | Vu et al. |
| 7,091,589 B2 | 8/2006 | Mori et al. |
| 7,091,593 B2 | 8/2006 | Ishimaru et al. |
| 7,105,931 B2 | 9/2006 | Attarwala |
| 7,129,117 B2 | 10/2006 | Hsu |
| 7,166,914 B2 | 1/2007 | DiStefano et al. |
| 7,170,152 B2 | 1/2007 | Huang et al. |
| 7,192,807 B1 | 3/2007 | Huemoeller et al. |
| 7,211,899 B2 | 5/2007 | Taniguchi et al. |
| 7,271,012 B2 | 9/2007 | Anderson |
| 7,274,099 B2 | 9/2007 | Hsu |
| 7,276,446 B2 | 10/2007 | Robinson et al. |
| 7,279,357 B2 | 10/2007 | Shimoishizaka et al. |
| 7,312,405 B2 | 12/2007 | Hsu |
| 7,321,164 B2 | 1/2008 | Hsu |
| 7,449,363 B2 | 11/2008 | Hsu |
| 7,458,794 B2 | 12/2008 | Schwaighofer et al. |
| 7,511,365 B2 | 3/2009 | Wu et al. |
| 7,690,109 B2 | 4/2010 | Mori et al. |
| 7,714,431 B1 | 5/2010 | Huemoeller et al. |
| 7,723,838 B2 | 5/2010 | Takeuchi et al. |
| 7,754,530 B2 | 7/2010 | Wu et al. |
| 7,808,799 B2 | 10/2010 | Kawabe et al. |
| 7,839,649 B2 | 11/2010 | Hsu |
| 7,843,064 B2 | 11/2010 | Kuo et al. |
| 7,852,634 B2 | 12/2010 | Sakamoto et al. |
| 7,855,460 B2 | 12/2010 | Kuwajima |
| 7,868,464 B2 | 1/2011 | Kawabata et al. |
| 7,887,712 B2 | 2/2011 | Boyle et al. |
| 7,914,693 B2 | 3/2011 | Jeong et al. |
| 7,915,737 B2 | 3/2011 | Nakasato et al. |
| 7,932,595 B1 | 4/2011 | Huemoeller et al. |
| 7,932,608 B2 | 4/2011 | Tseng et al. |
| 7,955,942 B2 | 6/2011 | Pagaila et al. |
| 7,978,478 B2 | 7/2011 | Inagaki et al. |
| 7,982,305 B1 | 7/2011 | Railkar et al. |
| 7,988,446 B2 | 8/2011 | Yeh et al. |
| 8,069,560 B2 | 12/2011 | Mori et al. |
| 8,137,497 B2 | 3/2012 | Sunohara et al. |
| 8,283,778 B2 | 10/2012 | Trezza |
| 8,314,343 B2 | 11/2012 | Inoue et al. |
| 8,367,943 B2 | 2/2013 | Wu et al. |
| 8,384,203 B2 | 2/2013 | Toh et al. |
| 8,390,125 B2 | 3/2013 | Tseng et al. |
| 8,426,246 B2 | 4/2013 | Toh et al. |
| 8,470,708 B2 | 6/2013 | Shih et al. |
| 8,476,769 B2 | 7/2013 | Chen et al. |
| 8,518,746 B2 | 8/2013 | Pagaila et al. |
| 8,536,695 B2 | 9/2013 | Liu et al. |
| 8,628,383 B2 | 1/2014 | Starling et al. |
| 8,633,397 B2 | 1/2014 | Jeong et al. |
| 8,698,293 B2 | 4/2014 | Otremba et al. |
| 8,704,359 B2 | 4/2014 | Tuominen et al. |
| 8,710,402 B2 | 4/2014 | Lei et al. |
| 8,710,649 B1 | 4/2014 | Huemoeller et al. |
| 8,728,341 B2 | 5/2014 | Ryuzaki et al. |
| 8,772,087 B2 | 7/2014 | Barth et al. |
| 8,786,098 B2 | 7/2014 | Wang |
| 8,877,554 B2 | 11/2014 | Tsai et al. |
| 8,890,628 B2 | 11/2014 | Nair et al. |
| 8,907,471 B2 | 12/2014 | Beyne et al. |
| 8,921,995 B1 | 12/2014 | Railkar et al. |
| 8,952,544 B2 | 2/2015 | Lin et al. |
| 8,980,691 B2 | 3/2015 | Lin |
| 8,980,727 B1 | 3/2015 | Lei et al. |
| 8,990,754 B2 | 3/2015 | Bird et al. |
| 8,994,185 B2 | 3/2015 | Lin et al. |
| 8,999,759 B2 | 4/2015 | Chia |
| 9,059,186 B2 | 6/2015 | Shim et al. |
| 9,064,936 B2 | 6/2015 | Lin et al. |
| 9,070,637 B2 | 6/2015 | Yoda et al. |
| 9,099,313 B2 | 8/2015 | Lee et al. |
| 9,111,914 B2 | 8/2015 | Lin et al. |
| 9,142,487 B2 | 9/2015 | Toh et al. |
| 9,159,678 B2 | 10/2015 | Cheng et al. |
| 9,161,453 B2 | 10/2015 | Koyanagi |
| 9,210,809 B2 | 12/2015 | Mallik et al. |
| 9,224,674 B2 | 12/2015 | Malatkar et al. |
| 9,275,934 B2 | 3/2016 | Sundaram et al. |
| 9,318,376 B1 | 4/2016 | Holm et al. |
| 9,355,881 B2 | 5/2016 | Goller et al. |
| 9,363,898 B2 | 6/2016 | Tuominen et al. |
| 9,396,999 B2 | 7/2016 | Yap et al. |
| 9,406,645 B1 | 8/2016 | Huemoeller et al. |
| 9,499,397 B2 | 11/2016 | Bowles et al. |
| 9,530,752 B2 | 12/2016 | Nikitin et al. |
| 9,554,469 B2 | 1/2017 | Hurwitz et al. |
| 9,660,037 B1 | 5/2017 | Zechmann et al. |
| 9,698,104 B2 | 7/2017 | Yap et al. |
| 9,704,726 B2 | 7/2017 | Toh et al. |
| 9,735,134 B2 | 8/2017 | Chen |
| 9,748,167 B1 | 8/2017 | Lin |
| 9,754,849 B2 | 9/2017 | Huang et al. |
| 9,837,352 B2 | 12/2017 | Chang et al. |
| 9,837,484 B2 | 12/2017 | Jung et al. |
| 9,859,258 B2 | 1/2018 | Chen et al. |
| 9,875,970 B2 | 1/2018 | Yi et al. |
| 9,887,103 B2 | 2/2018 | Scanlan et al. |
| 9,887,167 B1 | 2/2018 | Lee et al. |
| 9,893,045 B2 | 2/2018 | Pagaila et al. |
| 9,978,720 B2 | 5/2018 | Theuss et al. |
| 9,997,444 B2 | 6/2018 | Meyer et al. |

(56) References Cited

U.S. PATENT DOCUMENTS

| | | | |
|---|---|---|---|
| 10,014,292 B2 | 7/2018 | Or-Bach et al. |
| 10,037,975 B2 | 7/2018 | Hsieh et al. |
| 10,053,359 B2 | 8/2018 | Bowles et al. |
| 10,090,284 B2 | 10/2018 | Chen et al. |
| 10,109,588 B2 | 10/2018 | Jeong et al. |
| 10,128,177 B2 | 11/2018 | Kamgaing et al. |
| 10,134,687 B1 | 11/2018 | Kim et al. |
| 10,153,219 B2 | 12/2018 | Jeon et al. |
| 10,163,803 B1 | 12/2018 | Chen et al. |
| 10,170,386 B2 | 1/2019 | Kang et al. |
| 10,177,083 B2 | 1/2019 | Kim et al. |
| 10,211,072 B2 | 2/2019 | Chen et al. |
| 10,229,827 B2 | 3/2019 | Chen et al. |
| 10,256,180 B2 | 4/2019 | Liu et al. |
| 10,269,773 B1 | 4/2019 | Yu et al. |
| 10,297,518 B2 | 5/2019 | Lin et al. |
| 10,297,586 B2 | 5/2019 | Or-Bach et al. |
| 10,304,765 B2 | 5/2019 | Chen et al. |
| 10,347,585 B2 | 7/2019 | Shin et al. |
| 10,410,971 B2 | 9/2019 | Rae et al. |
| 10,424,530 B1 | 9/2019 | Alur et al. |
| 10,515,912 B2 | 12/2019 | Lim et al. |
| 10,522,483 B2 | 12/2019 | Shuto |
| 10,553,515 B2 | 2/2020 | Chew |
| 10,570,257 B2 | 2/2020 | Sun et al. |
| 10,658,337 B2 | 5/2020 | Yu et al. |
| 10,886,232 B2 | 1/2021 | Chen et al. |
| 11,264,331 B2 | 3/2022 | Chen et al. |
| 11,676,832 B2 | 6/2023 | Leschkies et al. |
| 2001/0020548 A1 | 9/2001 | Burgess |
| 2001/0030059 A1 | 10/2001 | Sugaya et al. |
| 2002/0036054 A1 | 3/2002 | Nakatani et al. |
| 2002/0048715 A1 | 4/2002 | Walczynski |
| 2002/0070443 A1 | 6/2002 | Mu et al. |
| 2002/0074615 A1 | 6/2002 | Honda |
| 2002/0135058 A1 | 9/2002 | Asahi et al. |
| 2002/0158334 A1 | 10/2002 | Vu et al. |
| 2002/0170891 A1 | 11/2002 | Boyle et al. |
| 2003/0059976 A1 | 3/2003 | Nathan et al. |
| 2003/0221864 A1 | 12/2003 | Bergstedt et al. |
| 2003/0222330 A1 | 12/2003 | Sun et al. |
| 2004/0080040 A1 | 4/2004 | Dotta et al. |
| 2004/0118824 A1 | 6/2004 | Burgess |
| 2004/0134682 A1 | 7/2004 | En et al. |
| 2004/0248412 A1 | 12/2004 | Liu et al. |
| 2005/0012217 A1 | 1/2005 | Mori et al. |
| 2005/0070092 A1 | 3/2005 | Kirby |
| 2005/0170292 A1 | 8/2005 | Tsai et al. |
| 2006/0014532 A1 | 1/2006 | Seligmann et al. |
| 2006/0073234 A1 | 4/2006 | Williams |
| 2006/0128069 A1 | 6/2006 | Hsu |
| 2006/0145328 A1 | 7/2006 | Hsu |
| 2006/0160332 A1 | 7/2006 | Gu et al. |
| 2006/0270242 A1 | 11/2006 | Verhaverbeke et al. |
| 2006/0283716 A1 | 12/2006 | Hafezi et al. |
| 2007/0035033 A1 | 2/2007 | Ozguz et al. |
| 2007/0042563 A1 | 2/2007 | Wang et al. |
| 2007/0077865 A1 | 4/2007 | Dysard et al. |
| 2007/0111401 A1 | 5/2007 | Kataoka et al. |
| 2007/0130761 A1 | 6/2007 | Kang et al. |
| 2007/0290300 A1 | 12/2007 | Kawakami |
| 2008/0006945 A1 | 1/2008 | Lin et al. |
| 2008/0011852 A1 | 1/2008 | Gu et al. |
| 2008/0076256 A1 | 3/2008 | Kawai et al. |
| 2008/0090095 A1 | 4/2008 | Nagata et al. |
| 2008/0113283 A1 | 5/2008 | Ghoshal et al. |
| 2008/0119041 A1 | 5/2008 | Magera et al. |
| 2008/0173792 A1 | 7/2008 | Yang et al. |
| 2008/0173999 A1 | 7/2008 | Chung et al. |
| 2008/0277776 A1 | 11/2008 | Enomoto |
| 2008/0296273 A1 | 12/2008 | Lei et al. |
| 2009/0084596 A1 | 4/2009 | Inoue et al. |
| 2009/0224372 A1 | 9/2009 | Johnson |
| 2009/0243065 A1 | 10/2009 | Sugino et al. |
| 2009/0250823 A1 | 10/2009 | Racz et al. |
| 2009/0278126 A1 | 11/2009 | Yang et al. |
| 2010/0013081 A1 | 1/2010 | Toh et al. |
| 2010/0059876 A1 | 3/2010 | Shimizu et al. |
| 2010/0062287 A1 | 3/2010 | Beresford et al. |
| 2010/0068837 A1 | 3/2010 | Kumar et al. |
| 2010/0078805 A1 | 4/2010 | Li et al. |
| 2010/0144101 A1 | 6/2010 | Chow et al. |
| 2010/0148305 A1 | 6/2010 | Yun |
| 2010/0160170 A1 | 6/2010 | Horimoto et al. |
| 2010/0248451 A1 | 9/2010 | Pirogovsky et al. |
| 2010/0264538 A1 | 10/2010 | Swinnen et al. |
| 2010/0301023 A1 | 12/2010 | Unrath et al. |
| 2010/0307798 A1 | 12/2010 | Izadian |
| 2011/0062594 A1 | 3/2011 | Maekawa et al. |
| 2011/0097432 A1 | 4/2011 | Yu et al. |
| 2011/0111300 A1 | 5/2011 | DelHagen et al. |
| 2011/0151663 A1 | 6/2011 | Chatterjee et al. |
| 2011/0204505 A1 | 8/2011 | Pagaila et al. |
| 2011/0259631 A1 | 10/2011 | Rumsby |
| 2011/0272191 A1 | 11/2011 | Li et al. |
| 2011/0291293 A1 | 12/2011 | Tuominen et al. |
| 2011/0304024 A1 | 12/2011 | Renna |
| 2011/0316147 A1 | 12/2011 | Shih et al. |
| 2012/0128891 A1 | 5/2012 | Takei et al. |
| 2012/0135608 A1 | 5/2012 | Shimoi et al. |
| 2012/0146209 A1 | 6/2012 | Hu et al. |
| 2012/0164827 A1 | 6/2012 | Rajagopalan et al. |
| 2012/0229990 A1 | 9/2012 | Adachi et al. |
| 2012/0261805 A1 | 10/2012 | Sundaram et al. |
| 2013/0074332 A1 | 3/2013 | Suzuki |
| 2013/0105329 A1 | 5/2013 | Matejat et al. |
| 2013/0196501 A1 | 8/2013 | Sulfridge |
| 2013/0200528 A1 | 8/2013 | Lin et al. |
| 2013/0203190 A1 | 8/2013 | Reed et al. |
| 2013/0286615 A1 | 10/2013 | Inagaki et al. |
| 2013/0333930 A1* | 12/2013 | Koyanagi .............. H05K 1/184 |
| | | 174/258 |
| 2013/0341738 A1 | 12/2013 | Reinmuth et al. |
| 2014/0054075 A1 | 2/2014 | Hu |
| 2014/0092519 A1 | 4/2014 | Yang |
| 2014/0094094 A1 | 4/2014 | Rizzuto et al. |
| 2014/0103499 A1 | 4/2014 | Andry et al. |
| 2014/0252655 A1 | 9/2014 | Tran et al. |
| 2014/0353019 A1 | 12/2014 | Arora et al. |
| 2015/0043126 A1 | 2/2015 | Hurwitz et al. |
| 2015/0187691 A1 | 7/2015 | Vick |
| 2015/0228416 A1 | 8/2015 | Hurwitz et al. |
| 2015/0255344 A1 | 9/2015 | Ebefors et al. |
| 2015/0296610 A1 | 10/2015 | Daghighian et al. |
| 2015/0311093 A1 | 10/2015 | Li et al. |
| 2015/0359098 A1 | 12/2015 | Ock |
| 2015/0380356 A1 | 12/2015 | Chauhan et al. |
| 2016/0013135 A1 | 1/2016 | He et al. |
| 2016/0020163 A1 | 1/2016 | Shimizu et al. |
| 2016/0049371 A1 | 2/2016 | Lee et al. |
| 2016/0088729 A1* | 3/2016 | Kobuke ................ H05K 1/115 |
| | | 174/251 |
| 2016/0095203 A1 | 3/2016 | Min et al. |
| 2016/0118325 A1 | 4/2016 | Wang et al. |
| 2016/0118337 A1 | 4/2016 | Yoon et al. |
| 2016/0270242 A1 | 9/2016 | Kim et al. |
| 2016/0276325 A1 | 9/2016 | Nair et al. |
| 2016/0329299 A1 | 11/2016 | Lin et al. |
| 2016/0336296 A1 | 11/2016 | Jeong et al. |
| 2017/0047308 A1 | 2/2017 | Ho et al. |
| 2017/0064835 A1 | 3/2017 | Ishihara et al. |
| 2017/0207197 A1 | 7/2017 | Yu et al. |
| 2017/0223842 A1 | 8/2017 | Chujo et al. |
| 2017/0229432 A1 | 8/2017 | Lin et al. |
| 2017/0338254 A1 | 11/2017 | Reit et al. |
| 2018/0019197 A1 | 1/2018 | Boyapati et al. |
| 2018/0033779 A1 | 2/2018 | Park et al. |
| 2018/0047666 A1 | 2/2018 | Lin et al. |
| 2018/0116057 A1 | 4/2018 | Kajihara et al. |
| 2018/0145044 A1 | 5/2018 | Park et al. |
| 2018/0182727 A1 | 6/2018 | Yu |
| 2018/0197831 A1 | 7/2018 | Kim et al. |
| 2018/0204802 A1 | 7/2018 | Lin et al. |
| 2018/0308792 A1 | 10/2018 | Raghunathan et al. |

(56) References Cited

U.S. PATENT DOCUMENTS

| | | |
|---|---|---|
| 2018/0352658 A1 | 12/2018 | Yang |
| 2018/0374696 A1 | 12/2018 | Chen et al. |
| 2018/0376589 A1 | 12/2018 | Harazono |
| 2019/0088603 A1 | 3/2019 | Marimuthu et al. |
| 2019/0131224 A1 | 5/2019 | Choi et al. |
| 2019/0131270 A1 | 5/2019 | Lee et al. |
| 2019/0131284 A1 | 5/2019 | Jeng et al. |
| 2019/0189561 A1 | 6/2019 | Rusli |
| 2019/0229046 A1 | 7/2019 | Tsai et al. |
| 2019/0237430 A1 | 8/2019 | England |
| 2019/0285981 A1 | 9/2019 | Cunningham et al. |
| 2019/0306988 A1 | 10/2019 | Grober et al. |
| 2019/0326224 A1 | 10/2019 | Aoki |
| 2019/0355675 A1 | 11/2019 | Lee et al. |
| 2019/0355680 A1 | 11/2019 | Chuang et al. |
| 2019/0369321 A1 | 12/2019 | Young et al. |
| 2020/0003936 A1 | 1/2020 | Fu et al. |
| 2020/0039002 A1 | 2/2020 | Sercel et al. |
| 2020/0130131 A1 | 4/2020 | Togawa et al. |
| 2020/0163218 A1 | 5/2020 | Mok |
| 2020/0357947 A1 | 11/2020 | Chen et al. |
| 2020/0358163 A1 | 11/2020 | See et al. |
| 2020/0395306 A1 | 12/2020 | Chen et al. |
| 2021/0005550 A1 | 1/2021 | Chavali et al. |

FOREIGN PATENT DOCUMENTS

| | | |
|---|---|---|
| CN | 1971894 A | 5/2007 |
| CN | 100463128 C | 2/2009 |
| CN | 100502040 C | 6/2009 |
| CN | 100524717 C | 8/2009 |
| CN | 100561696 C | 11/2009 |
| CN | 102024713 A | 4/2011 |
| CN | 102437110 A | 5/2012 |
| CN | 104637912 A | 5/2015 |
| CN | 105436718 A | 3/2016 |
| CN | 105575938 A | 5/2016 |
| CN | 106531647 A | 3/2017 |
| CN | 106653703 A | 5/2017 |
| CN | 107428544 A | 12/2017 |
| CN | 108028225 A | 5/2018 |
| CN | 109155246 A | 1/2019 |
| CN | 111492472 A | 8/2020 |
| EP | 0264134 A2 | 4/1988 |
| EP | 1536673 A1 | 6/2005 |
| EP | 1478021 B1 | 7/2008 |
| EP | 2023382 A1 | 2/2009 |
| EP | 1845762 B1 | 5/2011 |
| EP | 2942808 A1 | 11/2015 |
| JP | H06152089 A | 5/1994 |
| JP | H11233950 A | 8/1999 |
| JP | 2001244591 A | 9/2001 |
| JP | 2002208778 A | 7/2002 |
| JP | 2002246755 A | 8/2002 |
| JP | 2003188340 A | 7/2003 |
| JP | 2004311788 A | 11/2004 |
| JP | 2004335641 A | 11/2004 |
| JP | 2006032556 A | 2/2006 |
| JP | 2008066517 A | 3/2008 |
| JP | 2008515645 A | 5/2008 |
| JP | 4108285 B2 | 6/2008 |
| JP | 2009081423 A | 4/2009 |
| JP | 2010129723 A | 6/2010 |
| JP | 2010528866 A | 8/2010 |
| JP | 2010529664 A | 8/2010 |
| JP | 2012069926 A | 4/2012 |
| JP | 5004378 B2 | 8/2012 |
| JP | 5111342 B2 | 1/2013 |
| JP | 2013176835 A | 9/2013 |
| JP | 2013207006 A | 10/2013 |
| JP | 2013222889 A | 10/2013 |
| JP | 5608605 B2 | 10/2014 |
| JP | 5693977 B2 | 4/2015 |
| JP | 5700241 B2 | 4/2015 |
| JP | 2015070007 A | 4/2015 |
| JP | 201692107 A | 5/2016 |
| JP | 2016102964 A | 6/2016 |
| JP | 5981232 B2 | 8/2016 |
| JP | 2016171118 A | 9/2016 |
| JP | 2017148920 A | 8/2017 |
| JP | 2017197708 A | 11/2017 |
| JP | 6394136 B2 | 9/2018 |
| JP | 2018195620 A | 12/2018 |
| JP | 2019009297 A | 1/2019 |
| JP | 2019512168 A | 5/2019 |
| JP | 6542616 B2 | 7/2019 |
| JP | 6626697 B2 | 12/2019 |
| KP | 20040096537 A | 3/2007 |
| KP | 20160038293 A | 4/2016 |
| KR | 20010060103 A | 7/2001 |
| KR | 100714196 B1 | 5/2007 |
| KR | 100731112 B1 | 6/2007 |
| KR | 10-2008-0037296 A | 4/2008 |
| KR | 2008052491 A | 6/2008 |
| KR | 20100097893 A | 9/2010 |
| KR | 100997993 B1 | 12/2010 |
| KR | 101301507 B1 | 9/2013 |
| KR | 20140086375 A | 7/2014 |
| KR | 101494413 B1 | 2/2015 |
| KR | 20160013706 A | 2/2016 |
| KR | 20180113885 A | 10/2018 |
| KR | 101922884 B1 | 11/2018 |
| KR | 20180121893 A | 11/2018 |
| KR | 20190049411 A | 5/2019 |
| KR | 20190050781 A | 5/2019 |
| KR | 101975302 B1 | 8/2019 |
| KR | 102012443 B1 | 8/2019 |
| KR | 20200020632 A | 2/2020 |
| KR | 20210068581 A | 6/2021 |
| TW | 201042019 A | 12/2010 |
| TW | 201436015 A | 9/2014 |
| TW | 201511634 A | 3/2015 |
| TW | 201536130 A | 9/2015 |
| TW | 201642420 A | 12/2016 |
| TW | 1594397 B | 8/2017 |
| TW | 201735308 A | 10/2017 |
| TW | 201805400 A | 2/2018 |
| TW | 201824472 A | 7/2018 |
| TW | 201824746 A | 7/2018 |
| TW | 201916299 A | 4/2019 |
| TW | 201943321 A | 11/2019 |
| TW | 201944533 A | 11/2019 |
| TW | 202008524 A | 2/2020 |
| WO | 2011130300 A1 | 10/2011 |
| WO | 2013008415 A1 | 1/2013 |
| WO | 2013126927 A2 | 8/2013 |
| WO | 2014186538 A | 11/2014 |
| WO | 2015126438 A1 | 8/2015 |
| WO | 2016143797 A | 9/2016 |
| WO | 2017111957 A1 | 6/2017 |
| WO | 2018013122 A1 | 1/2018 |
| WO | 2018125184 A1 | 7/2018 |
| WO | 2019023213 A1 | 1/2019 |
| WO | 2019066988 A1 | 4/2019 |
| WO | 2019/177742 A1 | 9/2019 |
| WO | 2020010538 A1 | 1/2020 |

OTHER PUBLICATIONS

Taiwan Office Action dated Feb. 25, 2022, for Taiwan Patent Application No. 109119795.
PCT International Search Report and Written Opinion dated Aug. 12, 2022 for International Application No. PCT/US2022/026652.
Taiwan Office Action dated Sep. 22, 2022, for Taiwan Patent Application No. 111130159.
Japanese Office Action dated Feb. 28, 2023, for Japanese Patent Application No. 2021-574255.
PCT International Search Report and Written Opinion dated Nov. 4, 2022, for International Application No. PCT/US2022/036724.
Taiwan Office Action dated Jan. 9, 2023, for Taiwan Patent Application No. 109140460.
Japanese Office Action dated Jan. 31, 2023, for Japanese Patent Application No. 2021-566586.

(56) References Cited

OTHER PUBLICATIONS

Korean Office Action dated Mar. 10, 2023, for Korean Patent Application No. 10-2021-7040360.
Korean Office Action dated Mar. 10, 2023, for Korean Patent Application No. 10-2021-7040365.
Japanese Office Action dated Feb. 7, 2023, for Japanese Patent Application No. 2021-566585.
Taiwan Office Action issued to U.S. Appl. No. 10/914,056 on Apr. 27, 2023.
Korean Office Action issued to Patent Application No. 109140506 on May 11, 2023.
Japanese Office Action issued to Patent Application No. 2021-574255 on Sep. 12, 2023.
Japanese Office Action dated Aug. 29, 2023, for Japanese Patent Application No. 2022-529566.
PCT International Search Report and Written Opinion dated Sep. 15, 2023, for International Application No. PCT/US2023/021345 .
. . .
Office Action for Korean Application No. 10-2022-7001325 dated Nov. 16, 2023.
Taiwan Office Action dated Oct. 17, 2023, for Taiwan Patent Application No. 110138256.
Taiwan Office Action issued to patent application No. 110108250 on Jul. 31, 2024.
Taiwan Office Action dated Feb. 5, 2024, for Taiwan Patent Application No. 112135866.
Japanese Office Action dated Feb. 27, 2024 for Application No. 2023-501778.
Makoto Fujiwara et al., Extended Abstracts of the 2008 International Conference on SSDM, Tsukuba, 2008, pp. 958-959.
Korean Office Action issued to Patent Application No. 10-2024-7009552 on Apr. 11, 2024.
Taiwan Office Action dated Apr. 8, 2024, for Taiwan Patent Application No. 113106910.
Taiwan Office Action dated May 10, 2024, for Taiwan Patent Application No. 110112309.
Korean Office Action dated May 17, 2024, for Korean Patent Application No. 10-2021-0043866.
Chinese Office Action dated Apr. 24, 2024, for Chinese Patent Application No. 2020800340030.
Singapore Search Report issued to application No. 11202260565R on Jun. 24, 2024.
Japanese Office Action dated Apr. 2, 2024, for Japanese Patent Application No. 2023-504680.
Allresist Gmbh—Strausberg et al.: "Resist-Wiki: Adhesion promoter HMDS and diphenylsilanedio (AR 300-80) - . . . - Aallresist GmbH—Strausberg, Germany", Apr. 12, 2019 (Apr. 12, 2019), XP055663206, Retrieved from the Internet: URL:https://web.archive.org/web/2019041220micals-adhesion-promoter-hmds-and-diphenyl2908/https://www.allresist.com/process-chemicals-adhesion-promoter-hmds-and-diphenylsilanedio/, [retrieved on Jan. 29, 2020].
Amit Kelkar, et al. "Novel Mold-free Fan-out Wafer Level Package using Silicon Wafer", IMAPS 2016—49th International Symposium on Microelectronics—Pasadena, CA USA—Oct. 10-13, 2016, 5 pages. (IMAPS 2016—49th International Symposium on Microelectronics—Pasadena, CA USA—Oct. 10-13, 2016, 5 pages.).
Arifur Rahman. "System-Level Performance Evaluation of Three-Dimensional Integrated Circuits", vol. 8, No. 6, Dec. 2000. pp. 671-678.
Baier, T. et al., Theoretical Approach to Estimate Laser Process Parameters for Drilling in Crystalline Silicon, Prog. Photovolt: Res. Appl. 18 (2010) 603-606, 5 pages.
Chien-Wei Chien et al "Chip Embedded Wafer Level Packaging Technology for Stacked RF-SiP Application",2007 IEEE, pp. 305-310.
Chien-Wei Chien et al. "3D Chip Stack With Wafer Through Hole Technology". 6 pages.
Doany, F.E., et al.—"Laser release process to obtain freestanding multilayer metal-polyimide circuits," IBM Journal of Research and Development, vol. 41, Issue 1/2, Jan./Mar. 1997, pp. 151-157.
Dyer, P.E., et al.—"Nanosecond photoacoustic studies on ultraviolet laser ablation of organic polymers," Applied Physics Letters, vol. 48, No. 6, Feb. 10, 1986, pp. 445-447.
Han et al.—"Process Feasibility and Reliability Performance of Fine Pitch Si Bare Chip Embedded in Through Cavity of Substrate Core," IEEE Trans. Components, Packaging and Manuf. Tech., vol. 5, No. 4, pp. 551-561, 2015. [Han et al. IEEE Trans. Components, Packaging and Manuf. Tech., vol. 5, No. 4, pp. 551-561, 2015.].
Han et al.—"Through Cavity Core Device Embedded Substrate for Ultra-Fine-Pitch Si Bare Chips; (Fabrication feasibility and residual stress evaluation)", ICEP-IAAC, 2015, pp. 174-179. [Han et al., ICEP-IAAC, 2015, pp. 174-179.].
Han, Younggun, et al.—"Evaluation of Residual Stress and Warpage of Device Embedded Substrates with Piezo-Resistive Sensor Silicon Chips" technical paper, Jul. 31, 2015, pp. 81-94.
International Search Report and the Written Opinion for International Application No. PCT/US2019/064280 mailed Mar. 20, 2020, 12 pages.
International Search Report and Written Opinion for Application No. PCT/US2020/026832 dated Jul. 23, 2020.
Italian search report and written opinion for Application No. IT 201900006736 dated Mar. 2, 2020.
Italian Search Report and Written Opinion for Application No. IT 201900006740 dated Mar. 4, 2020.
Junghoon Yeom', et al. "Critical Aspect Ratio Dependence in Deep Reactive Ion Etching of Silicon", 2003 IEEE. pp. 1631-1634.
K. Sakuma et al. "3D Stacking Technology with Low-Volume Lead-Free Interconnections", IBM T.J. Watson Research Center. 2007 IEEE, pp. 627-632.
Kenji Takahashi et al. "Current Status of Research and Development for Three-Dimensional Chip Stack Technology", Jpn. J. Appl. Phys. vol. 40 (2001) pp. 3032-3037, Part 1, No. 4B, Apr. 2001. 6 pages.
Kim et al. "A Study on the Adhesion Properties of Reactive Sputtered Molybdenum Thin Films with Nitrogen Gas on Polyimide Substrate as a Cu Barrier Layer," 2015, Journal of Nanoscience and Nanotechnology, vol. 15, No. 11, pp. 8743-8748, doi: 10.1166/jnn.2015.11493.
Knickerbocker, J.U., et al.—"Development of next-generation system-on-package (SOP) technology based on silicon carriers with fine-pitch chip interconnection," IBM Journal of Research and Development, vol. 49, Issue 4/5, Jul./Sep. 2005, pp. 725-753.
Knickerbocker, John U., et al.—"3-D Silicon Integration and Silicon Packaging Technology Using Silicon Through-Vias," IEEE Journal of Solid-State Circuits, vol. 41, No. 8, Aug. 2006, pp. 1718-1725.
Knorz, A. et al., High Speed Laser Drilling: Parameter Evaluation and Characterisation, Presented at the 25th European PV Solar Energy Conference and Exhibition, Sep. 6-10, 2010, Valencia, Spain, 7 pages.
L. Wang, et al. "High aspect ratio through-wafer interconnections for 3Dmicrosystems", 2003 IEEE. pp. 634-637.
Lee et al. "Effect of sputtering parameters on the adhesion force of copper/molybdenum metal on polymer substrate," 2011, Current Applied Physics, vol. 11, pp. S12-S15, doi: 10.1016/j.cap.2011.06.019.
Liu, C.Y. et al., Time Resolved Shadowgraph Images of Silicon during Laser Ablation: Shockwaves and Particle Generation, Journal of Physics: Conference Series 59 (2007) 338-342, 6 pages.
Narayan, C., et al.—"Thin Film Transfer Process for Low Cost MCM's," Proceedings of 1993 IEEE/CHMT International Electronic Manufacturing Technology Symposium, Oct. 4-6, 1993, pp. 373-380.
NT Nguyen et al. "Through-Wafer Copper Electroplating for Three-Dimensional Interconnects", Journal of Micromechanics and Microengineering. 12 (2002) 395-399. 2002 IOP.
PCT International Search Report and Written Opinion dated Aug. 28, 2020, for International Application No. PCT/US2020/032245.
PCT International Search Report and Written Opinion dated Sep. 15, 2020, for International Application No. PCT/US2020/035778.
Ronald Hon et al. "Multi-Stack Flip Chip 3D Packaging with Copper Plated Through-Silicon Vertical Interconnection", 2005 IEEE. pp. 384-389.

(56) References Cited

OTHER PUBLICATIONS

S. W. Ricky Lee et al. "3D Stacked Flip Chip Packaging with Through Silicon Vias and Copper Plating or Conductive Adhesive Filling", 2005 IEEE, pp. 798-801.
Shen, Li-Cheng, et al.—"A Clamped Through Silicon Via (TSV) Interconnection for Stacked Chip Bonding Using Metal Cap on Pad and Metal Column Forming in Via," Proceedings of 2008 Electronic Components and Technology Conference, pp. 544-549.
Shi, Tailong, et al.—"First Demonstration of Panel Glass Fan-out (GFO) Packages for High I/O Density and High Frequency Multi-chip Integration," Proceedings of 2017 IEEE 67th Electronic Components and Technology Conference, May 30-Jun. 2, 2017, pp. 41-46.
Srinivasan, R., et al.—"Ultraviolet Laser Ablation of Organic Polymers," Chemical Reviews, 1989, vol. 89, No. 6, pp. 1303-1316.
Trusheim, D. et al., Investigation of the Influence of Pulse Duration in Laser Processes for Solar Cells, Physics Procedia Dec. 2011, 278-285, 9 pages.
Wu et al., Microelect. Eng., vol. 87 2010, pp. 505-509.
Yu et al. "High Performance, High Density RDL for Advanced Packaging," 2018 IEEE 68th Electronic Components and Technology Conference, pp. 587-593, DOI 10.1109/ETCC.2018.0009.
Yu, Daquan—"Embedded Silicon Fan-out (eSiFO) Technology for Wafer-Level System Integration," Advances in Embedded and Fan-Out Wafer-Level Packaging Technologies, First Edition, edited by Beth Keser and Steffen Kroehnert, published 2019 by John Wiley & Sons, Inc., pp. 169-184.
Taiwan Office Action dated Oct. 27, 2020 for Application No. 108148588.
PCT International Search Report and Written Opinion dated Feb. 17, 2021 for International Application No. PCT/US2020/057787.
PCT International Search Report and Written Opinion dated Feb. 19, 2021, for International Application No. PCT/US2020/057788.
U.S. Office Action dated May 13, 2021, in U.S. Appl. No. 16/870,843.
Chen, Qiao—"Modeling, Design and Demonstration of Through-Package-Vias in Panel-Based Polycrystalline Silicon Interposers for High Performance, High Reliability and Low Cost," a Dissertation presented to the Academic Faculty, Georgia Institute of Technology, May 2015, 168 pages.
Lannon, John Jr., et al.—"Fabrication and Testing of a TSV-Enabled Si Interposer with Cu- and Polymer-Based Multilevel Metallization," IEEE Transactions on Components, Packaging and Manufacturing Technology, vol. 4, No. 1, Jan. 2014, pp. 153-157.
Malta, D., et al.—"Fabrication of TSV-Based Silicon Interposers," 3D Systems Integration Conference (3DIC), 2010 IEEE International, Nov. 16-18, 2010, 6 pages.
Tecnisco, Ltd.—"Company Profile" presentation with product introduction, date unknown, 26 pages.
Wang et al. "Study of Direct Cu Electrodeposition on Ultra-Thin Mo for Copper Interconnect", State key lab of ASIC and system, School of microelectronics, Fudan University, Shanghai, China; 36 pages.
International Search Report and Written Opinion dated Oct. 7, 2021 for Application No. PCT/US2021037375.
PCT International Search Report and Written Opinion dated Oct. 19, 2021, for International Application No. PCT/US2021/038690.
PCT International Search Report and Written Opinion dated Feb. 4, 2022, for International Application No. PCT/US2021/053830.
Korean Office Action dated May 8, 2024, for Korean Patent Application No. 10-2021-0029412.

* cited by examiner

HIGH CONNECTIVITY DEVICE STACKING

CROSS-REFERENCE TO RELATED APPLICATIONS

This application is a divisional of U.S. Nonporivisional Patent application Ser. No. 17/578,271, filed Jan. 18, 2022, which is a divisional of U.S. Nonprovisional patent application Ser. No. 16/814,785, filed Mar. 10, 2020, which is herein incorporated by reference in its entirety.

BACKGROUND

Field

Embodiments of the present disclosure generally relate to stacked miniaturized electronic devices and methods of forming the same. More specifically, embodiments described herein relate to PCB and package spacers and methods of forming the same.

Description of the Related Art

Due to an ever-increasing demand for miniaturized electronic devices with reduced footprint, electronic devices have evolved into complex 2.5D and 3D stacked devices. The evolution of stacked electronic device design has resulted in greater circuit densities in efforts to improve speed and processing capabilities and has also imposed corresponding demands on the materials, components, and processes used in the fabrication of such electronic devices.

Conventionally, components of miniaturized electronic devices have been vertically stacked with spacers disposed between the individual device components to provide physical separation therebetween. These spacers are typically formed of a molding compound (e.g., epoxy molding compound, FR-4 and FR-5 grade woven fiberglass cloth with epoxy resin binders, and the like) and are patterned via mechanical processes to enable electrical connectivity of the device components. However, the materials utilized for the molding compound, as well as the patterning processes for the spacers, have several limitations that impede electronic device scaling and overall device performance.

In particular, as a result of the thermal properties of current molding compound materials, coefficient of thermal expansion (CTE) mismatch may occur between the device components and adjacent spacers, thus necessitating larger solder bumps with greater spacing to mitigate any warpage of the device components or the spacers caused by the CTE mismatch. Furthermore, the intrinsic properties of these molding compound materials also cause difficulty in patterning fine (e.g., less than 50 μm) features in the spacers, which is magnified by the resolution limitations of the mechanical structuring processes themselves. Therefore, spacers utilizing conventional molding compound materials may create a bottleneck in the fabrication of stacked miniaturized electronic devices with reduced footprint.

Therefore, what is needed in the art are improved spacers and structures for stacked miniaturized electronic devices and methods of forming the same.

SUMMARY

The present disclosure generally relates to stacked miniaturized electronic devices and methods of forming the same. More specifically, embodiments described herein relate to semiconductor device spacers and methods of forming the same.

In one embodiment, a semiconductor device spacer is provided. The semiconductor device spacer includes a frame having a first surface opposite a second surface, a frame material including a polymer-based dielectric material with spherical ceramic fillers, and a via including a via surface defining an opening extending through the frame from the first surface to the second surface. The via has a diameter between about 10 μm and about 150 μm. An electrical interconnection is further disposed within the via on the via surface.

In one embodiment, a semiconductor device assembly is provided. The semiconductor device assembly includes a first printed circuit board (PCB) having a first glass fiber reinforced epoxy resin material and a first electrical distribution layer formed on the first glass fiber reinforced epoxy resin material. The semiconductor device assembly further includes a second PCB having a second glass fiber reinforced epoxy resin material and a second electrical distribution layer formed on the second glass fiber reinforced epoxy resin material. The semiconductor device assembly also includes a device spacer interposed between the first PCB and the second PCB to facilitate a physical space therebetween. The device spacer includes a frame having a first surface opposite a second surface, a frame material including a polymer-based dielectric material with spherical ceramic fillers, and a via including a via surface defining an opening extending through the frame from the first surface to the second surface. The via has a diameter between about 10 μm and about 150 μm. An electrical interconnection is further disposed within the via on the via surface to form at least part of a conductive path extending between at least a portion of the first and second electrical distribution layers.

In one embodiment, a semiconductor device assembly is provided. The semiconductor device assembly includes a printed circuit board (PCB) having a first glass fiber reinforced epoxy resin material and a first electrical distribution layer formed on the first glass fiber reinforced epoxy resin material. The semiconductor device assembly further includes a silicon substrate having a silicon cure structure with a thickness less than about 1000 μm and a second electrical distribution layer formed on the silicon core structure. The semiconductor device assembly also includes a device spacer interposed between the PCB and the silicon substrate to facilitate a physical space therebetween. The device spacer includes a frame having a first surface opposite a second surface and a thickness between about 400 μm and about 1600 μm, a frame material including a polymer-based dielectric material with spherical ceramic fillers, and a via including a via surface defining an opening extending through the frame from the first surface to the second surface. The thickness of the frame is substantially similar to a height of the physical space and the via has a diameter between about 10 μm and about 150 μm. An electrical interconnection is further disposed within the via on the via surface to form at least part of a conductive path extending between at least a portion of the first and second electrical distribution layers. A ratio of an area of the device spacer relative to an area of a surface of the PCB or the silicon substrate is between about 0.15 and about 0.85.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the Figures. It is contemplated that elements and features of one embodiment may be beneficially incorporated in other embodiments without further recitation.

DETAILED DESCRIPTION

Figure 1A:
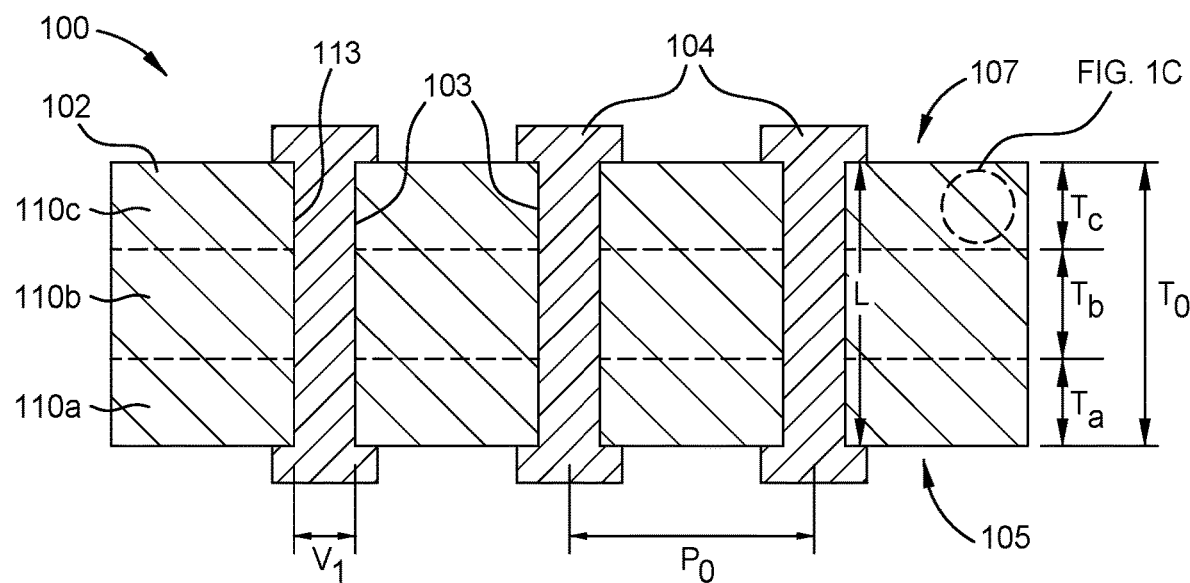
FIGS. 1A and 1B schematically illustrate cross-sectional views of semiconductor device spacers, according to embodiments described herein.

The present disclosure generally relates to stacked miniaturized electronic devices and methods of forming the same. More specifically, embodiments described herein relate to semiconductor device spacers and methods of forming the same. The semiconductor device spacers described herein may be utilized to form stacked semiconductor package assemblies, stacked PCB assemblies, and the like.

The stacked semiconductor devices and semiconductor device spacers disclosed herein are intended to replace more conventional semiconductor PCB and package assemblies utilizing spacers fabricated from molding compound materials (e.g., epoxy molding compound, FR-4 and FR-5 grade woven fiberglass cloth with epoxy resin binders, and the like). Generally, the scalability of stacked PCBs and package assemblies is limited in part by the intrinsic properties of the molding compound materials utilized to form these spacers. For example, the rigidity of these materials causes difficulty in patterning fine (e.g., micron scale) features in the spacers for interconnectivity of the individual device components within a stacked assembly. Furthermore, as a result of the thermal properties of currently-utilized molding compound materials, coefficient of thermal expansion (CTE) mismatch may occur between the spacers and any device components disposed adjacent thereto. Therefore, current PCB and package assemblies necessitate larger solder bumps with greater spacing to mitigate the effect of any warpage caused by CTE mismatch. Accordingly, conventional semiconductor PCB and package assemblies are characterized by low through-structure electrical bandwidths resulting in decreased overall power and efficiency. The methods and apparatus disclosed herein provide semiconductor device spacers that overcome many of the disadvantages associated with conventional PCB and package assemblies described above.

FIGS. 1A-1C, 2A, and 2B illustrate cross-sectional views of a semiconductor device spacer 100 according to some embodiments. The semiconductor device spacer 100 may be utilized for physical separation, structural support, and electrical interconnection of semiconductor devices and components mounted thereto. The semiconductor device spacer 100 may also be employed for stacking semiconductor packaging substrates, thus enabling economical space utilization in small electronic products and/or enhanced I/O connections and bandwidth between multiple packaging substrates. The semiconductor device spacer 100 also minimizes track length between different inter-operating parts to shorten routing of interconnections between substrates.

The semiconductor device spacer 100 generally includes a frame 102 having one or more holes or vias 103 formed therethrough. In one embodiment, the frame 102 is formed of polymer-based dielectric materials. For example, the frame 102 is formed from a flowable build-up material. In further embodiments, the frame 102 is formed of an epoxy resin material having ceramic fillers 130 (shown in FIG. 1C), such as silica ($SiO_2$) particles. Other examples of ceramic fillers 130 that may be utilized to form the frame 102 include aluminum nitride (AlN), aluminum oxide ($Al_2O_3$), silicon carbide (SiC), silicon nitride ($Si_3N_4$), $Sr_2Ce_2Ti_5O_{16}$, zirconium silicate ($ZrSiO_4$), wollastonite ($CaSiO_3$), beryllium oxide (BeO), cerium dioxide ($CeO_2$), boron nitride (BN), calcium copper titanium oxide ($CaCu_3Ti_4O_{12}$), magnesium oxide (MgO), titanium dioxide ($TiO_2$), zinc oxide (ZnO) and the like.

Figure 1B:
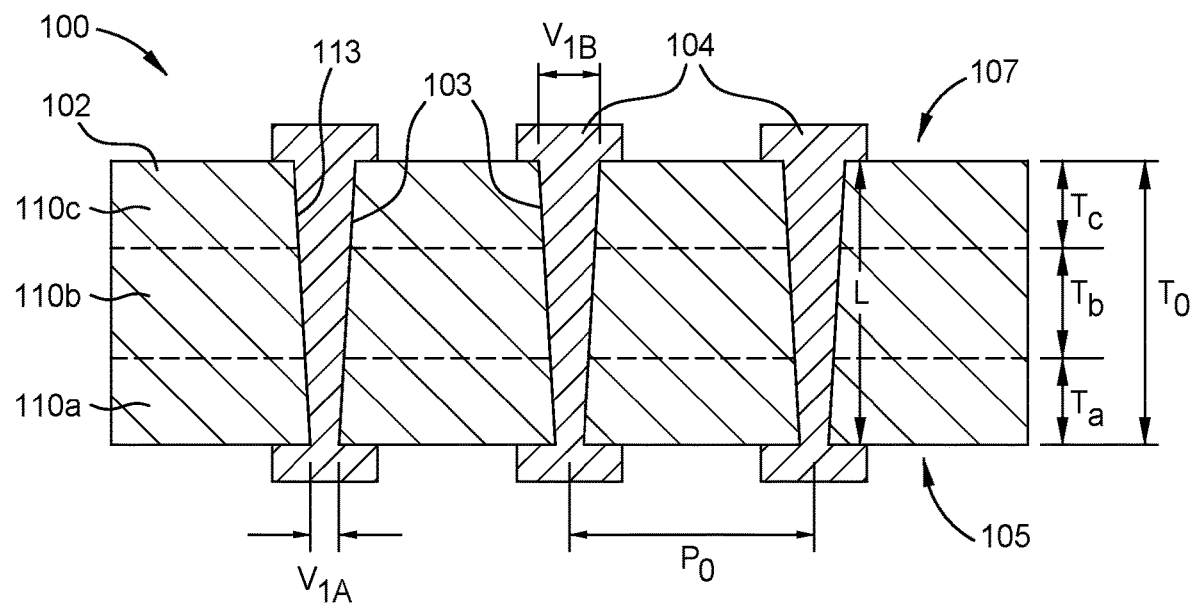
Figure 1C:
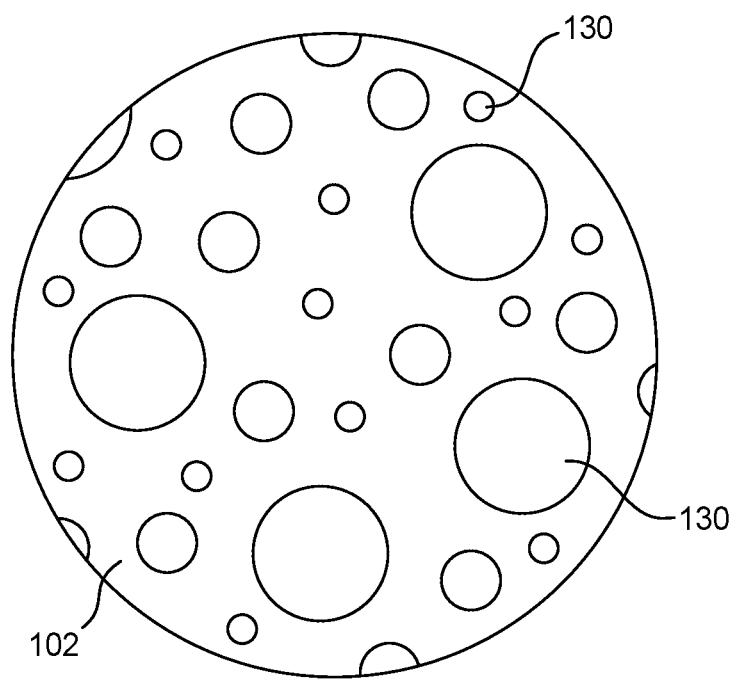
FIG. 1C illustrates an enlarged cross-sectional view of a portion of a semiconductor device spacer, according to embodiments described herein.

The ceramic fillers 130 are generally spherical in shape or morphology as depicted in the enlarged cross-sectional view of the frame 102 in FIG. 1C. As utilized herein, the term "spherical" refers to any round, ellipsoid, or spheroid shape. For example, in some embodiments, the ceramic fillers 130 may have an elliptic shape, an oblong oval shape, or other similar round shape. However, other morphologies are also contemplated. In some examples, the ceramic fillers 130 utilized to form the frame 102 include particles ranging in diameter between about 40 nm and about 150 nm, such as between about 80 nm and about 100 nm. For example, the ceramic fillers 130 include particles ranging in diameter between about 200 nm and about 800 nm, such as between about 300 nm and about 600 nm. In some examples, the ceramic fillers 130 include particles having a substantially uniform diameter. In other examples, the ceramic fillers 130 include particles differing in diameter. The particles of the ceramic fillers 130 have a packing density (e.g., fraction of the solid volume of the frame 102 made up by the volume of the ceramic fillers 130) between about 0.02 and about 0.99, such as a packing density between about 0.1 and about 0.98. For example, the ceramic fillers 130 in the frame 102 may have a packing density between about 0.2 and about 0.96, such as a packing density between about 0.5 and about 0.95.

The frame 102 may have any desired morphology and dimensions. In some embodiments, the frame 102 has a polygonal morphology. For example, the frame 102 has a substantially rectangular shape with lateral dimensions between about 5 mm and about 100 mm, such as between about 10 mm and about 80 mm, for example between about 15 mm and about 50 mm. Generally the frame 102 has a thickness $T_0$ between about 45 μm and about 5000 μm, such as a thickness $T_0$ between about 100 μm and about 3000 μm. For example, the frame 102 has a thickness $T_0$ between about 200 μm and about 2000 μm, such as a thickness $T_0$ between about 400 μm and about 1600 μm.

In some embodiments, the frame 102 is formed of one or more layers 110 of polymer-based dielectric materials that are laminated and cured together to form a single, integral body (e.g., block) for the frame 102. For example, the frame 102 is formed of stacked individual layers 110a-c that are laminated and cured together to form a single, integral body. In such an example, the thickness $T_0$ of the frame 102 is the sum of the thicknesses $T_{A-C}$ of the individual layers 110a-110c, respectively. Each individual layer 110a-110c utilized for the frame 102 has a thickness $T_{A-B}$ between about 10 um and about 150 um, such as between about 25 um and about 125 um, for example between about 50 um and about 100 um.

The holes or vias 103 (hereinafter referred to as "vias") are formed in the frame 102 to enable conductive electrical interconnections 104 to be routed through the frame 102. For example, the vias 103 extend from a first surface 105 of the frame 102 to an opposing second surface 107. Generally, the one or more vias 103 are substantially cylindrical in shape. However, other suitable morphologies for the vias 103 are also contemplated. The vias 103 may be formed as singular and isolated vias 103 through the frame 102 or in one or more groupings or arrays. In one embodiment, the vias 103 have a minimum pitch $P_0$ less than about 1200 μm, such as a minimum pitch $P_0$ between about 50 μm and about 1000 μm, such as between about 100 μm and about 800 μm. For example, the minimum pitch $P_0$ is between about 150 μm and about 600 μm. For clarity, "pitch" refers to the distance between centers of adjacent vias 103.

In the embodiment depicted in FIG. 1A, each of the one or more vias 103 has a substantially uniform diameter through the frame 102. For example, each of the one or more vias 103 has a uniform diameter $V_1$ less than about 500 μm throughout, such as a uniform diameter $V_1$ between about 10 μm and about 200 μm throughout. In a further example, each of the vias 103 has a uniform diameter $V_1$ between about 10 μm and about 180 μm throughout, such as a uniform diameter $V_1$ between about 10 μm and about 150 μm throughout.

Alternatively, in the embodiment depicted in FIG. 1B, each of the one or more vias 103 has a tapering diameter through the frame 102. For example, each of the one or more vias has a first diameter $V_{1A}$ at a first surface 105 that widens or expands to a second diameter $V_{1B}$ at a second surface 107. Thus, it may be said that each via 103 tapers from the diameter $V_{1B}$ to the diameter $V_{1A}$. In one example, the diameter $V_{1B}$ is less than about 500 μm, such between about 10 μm and about 200 μm, such as between about 10 μm and about 180 μm, such as between about 10 μm and about 150 μm. In one example, the diameter $V_{1A}$ is less than about 400 μm, such as between about 10 μm and about 130 μm, such as between about 10 μm and about 120 μm, such as between about 10 μm and about 100 μm.

The vias 103 provide channels through which one or more electrical interconnections 104 are formed in the semiconductor device spacer 100. In one embodiment, the vias 103 and the electrical interconnections 104 are formed through the entire thickness $T_0$ of the semiconductor device spacer 100 (i.e. from the first surface 105 to the second surface 107 of the semiconductor device spacer 100). For example, the electrical interconnections 104 have a longitudinal length L corresponding to the thickness $T_0$ of the semiconductor device spacer 100 between about 45 μm and about 5000 μm, such as a longitudinal length L between about 100 μm and about 3000 μm. In one example, the electrical interconnections 144 have a longitudinal length L between about 200 μm and about 2000 μm, such as a longitudinal length L between about 400 μm and about 1600 μm. In another embodiment, the vias 103 and/or electrical interconnections 104 are only formed through a portion of the thickness $T_0$ of the semiconductor device spacer 100. In further embodiments, the electrical interconnections 104 protrude from one or more surfaces of the semiconductor device spacer 100, such as the surfaces 105, 107 as depicted in FIGS. 1A and 1B. The electrical interconnections 104 are formed of any conductive materials used in the field of microelectronic devices, integrated circuits, circuit boards, and the like. For example, the electrical interconnections 104 are formed of a metallic material, such as copper, aluminum, gold, nickel, silver, palladium, tin, or the like.

In the embodiments depicted in FIGS. 1A-2B, the electrical interconnections 104 fill the vias 103. However, in some embodiments, the electrical interconnections 104 only line the surfaces of the sidewalls 113 of the vias 103 and do not fully fill (e.g., completely occupy) the vias 103. Thus, the interconnections 104 may have hollow cores therethrough.

Figure 2A:
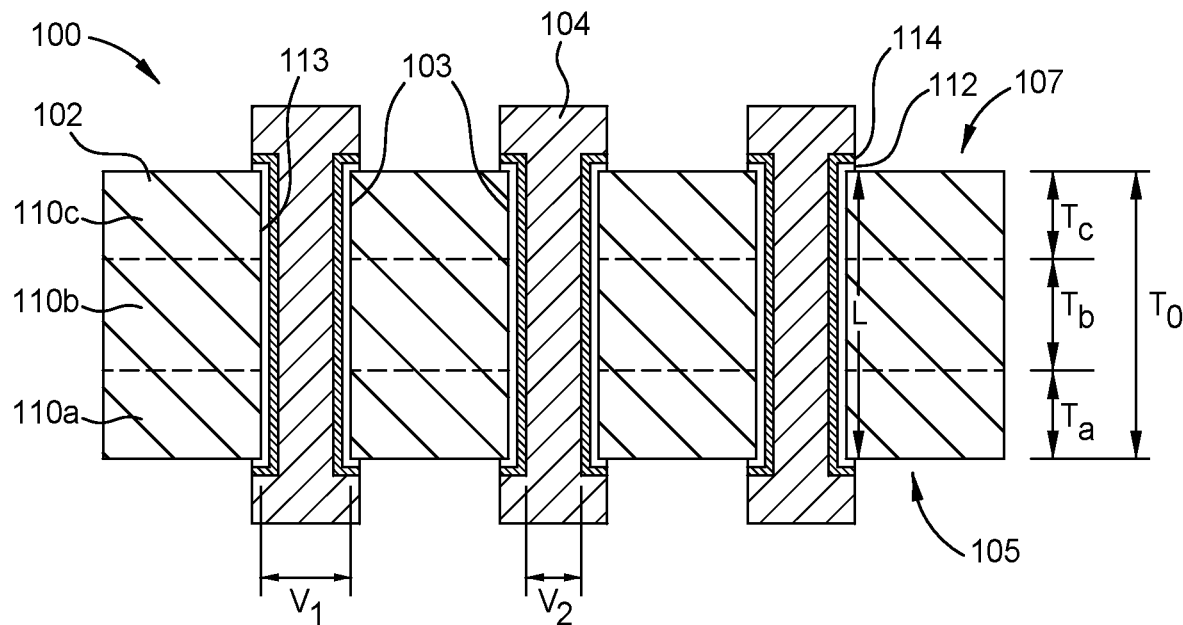
FIGS. 2A and 2B schematically illustrate cross-sectional views of semiconductor device spacers, according to embodiments described herein.
Figure 2B:
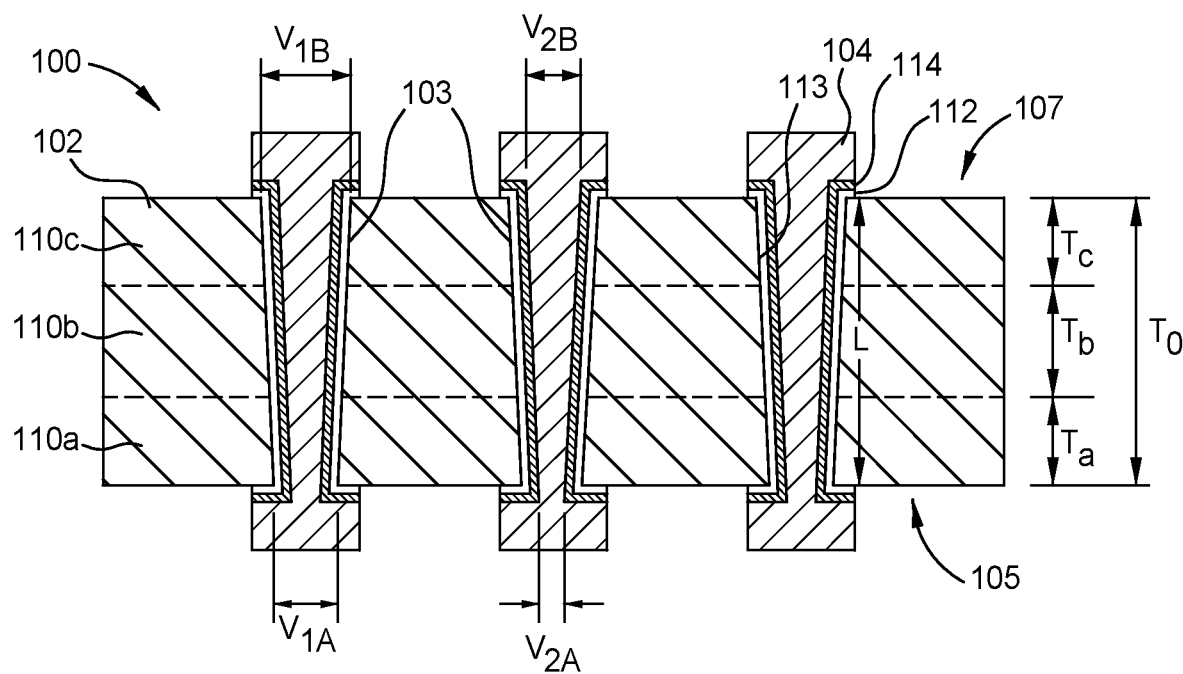

Furthermore, in FIGS. 1A and 1B, the electrical interconnections 104 have a diameter equal to the diameter of the vias 103 in which they are formed. In further embodiments, such as depicted in FIGS. 2A and 2B, the semiconductor device spacer 100 further includes an adhesion layer 112 and/or a seed layer 114 formed thereon for electrical isolation of the electrical interconnections 104. In one embodiment, the adhesion layer 112 is formed on surfaces of the semiconductor device spacer 100 adjacent to the electrical interconnections 104, including the sidewalls 113 of the vias 103. Thus, as depicted in FIGS. 2A and 2B, the electrical interconnections 104 have a diameter less than the diameter of the vias 103 in which they are formed. For example, in FIG. 2A, the electrical interconnections have a uniform diameter $V_2$ less than the diameter $V_1$ of the vias 103. In FIG. 2B, the electrical interconnections have a first diameter $V_{2A}$ less than the diameter $V_{1A}$ that tapers to a second diameter $V_{2B}$ less than a diameter $V_{1B}$.

The adhesion layer 112 is formed of any suitable materials, including but not limited to titanium, titanium nitride, tantalum, tantalum nitride, manganese, manganese oxide, molybdenum, cobalt oxide, cobalt nitride, silicon nitride and the like. In one embodiment, the adhesion layer 112 has a thickness between about 10 nm and about 300 nm, such as between about 50 nm and about 150 nm. For example, the adhesion layer 112 has a thickness between about 75 nm and about 125 nm, such as about 100 nm.

The optional seed layer 114 comprises a conductive material, including but not limited to copper, tungsten, aluminum, silver, gold, or any other suitable materials or combinations thereof. The seed layer 114 is formed on the adhesion layer 112 or directly on the sidewalls 113 of the vias 103 (on the frame 102). In one embodiment, the seed layer 114 has a thickness between about 50 nm and about 2000 nm, such as between about 100 nm and about 1000 nm. For example, the seed layer 112 has a thickness between about 150 nm and about 800 nm, such as about 500 nm.

Figure 3A:
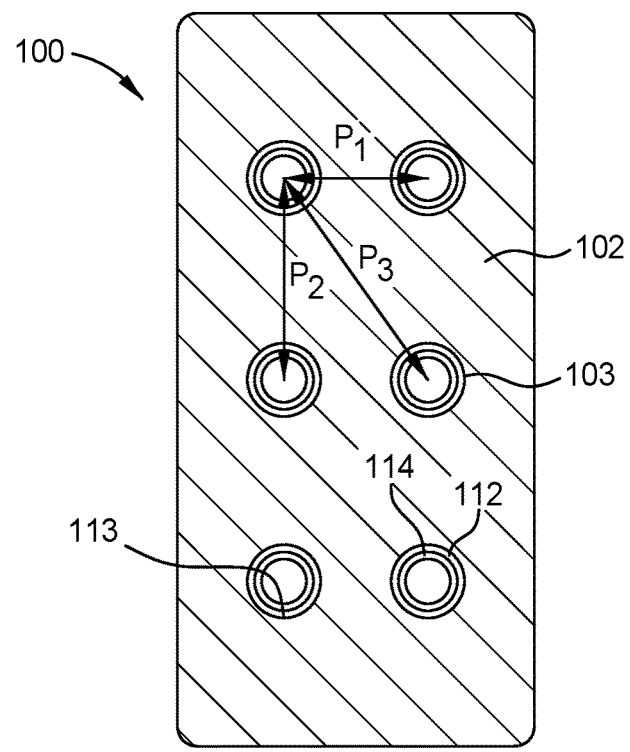
FIGS. 3A and 3B schematically illustrate top-down views of semiconductor device spacers, according to embodiments described herein.
Figure 3B:
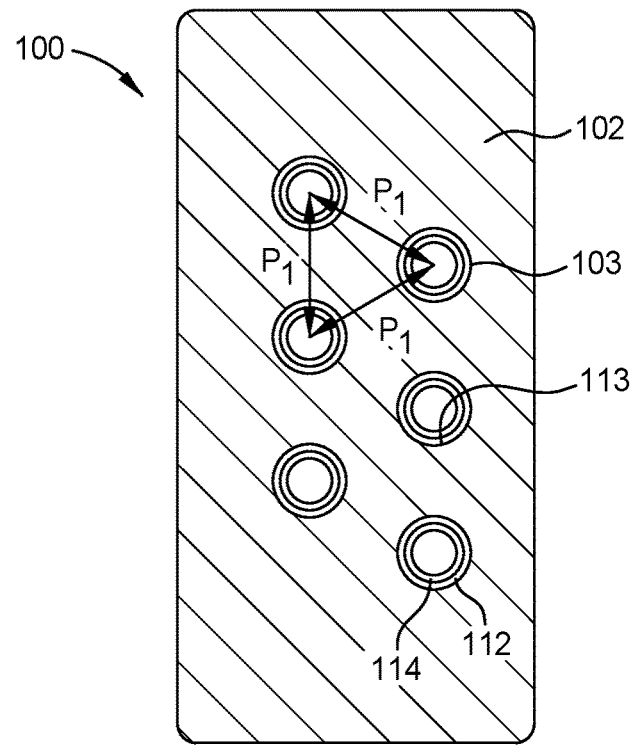

FIGS. 3A and 3B illustrate schematic top-down views of the semiconductor device spacer 100 with exemplary arrangements of vias 103 formed therein. As described above, the vias 103 are generally cylindrical in shape and thus, appear circular in FIGS. 3A and 3B. Other morphologies for the vias 103, however, are also contemplated. FIGS. 3A and 3B further depict the adhesion layer 112 and the seed layer 114 formed within each via 103. The adhesion layer 112 is formed on the sidewalls 113 of each via 103 and the seed layer 114 is formed on the adhesion layer 112. However, in some embodiments, the interconnections 104 may be formed through the vias 103 without the utilization of the adhesion layer 112 and/or the seed layer 114. In other embodiments, the seed layer 114 may be formed on the sidewalls 113 of the vias 103 without the utilization of the adhesion layer 112 prior to formation of the interconnections 104.

The vias 103 are formed in any suitable arrangement and number through the frame 102. As depicted in FIG. 3A, six vias 103 are formed through the frame 102 in a linear arrangement having two columns and three rows of vias 103, wherein the vias 103 in each column and in each row are aligned with one another. A first pitch $P_1$ is depicted between adjacent vias 103 aligned in each row, a second pitch $P_2$ is depicted between adjacent vias 103 aligned in each column, and a third pitch $P_3$ is depicted between adjacent and diagonal vias 103 across the two columns. At least two of the pitches $P_1$, $P_2$, or $P_3$ may be different from one another in length.

FIG. 3B illustrates an alternative arrangement also having two columns and three rows of vias 103, wherein only the vias 103 in each column are aligned. Accordingly, the pitch between all adjacent vias 103 is substantially the same in length, represented in FIG. 3B by the pitch $P_1$. As described above, "pitch" refers to the distance between centers of adjacent vias 103. Although two arrangements of vias 103 are depicted, FIGS. 3A and 3B are only exemplary and any suitable number and arrangement of vias 103 may be formed in the frame 102 of the semiconductor device spacer 100.

Figure 4:
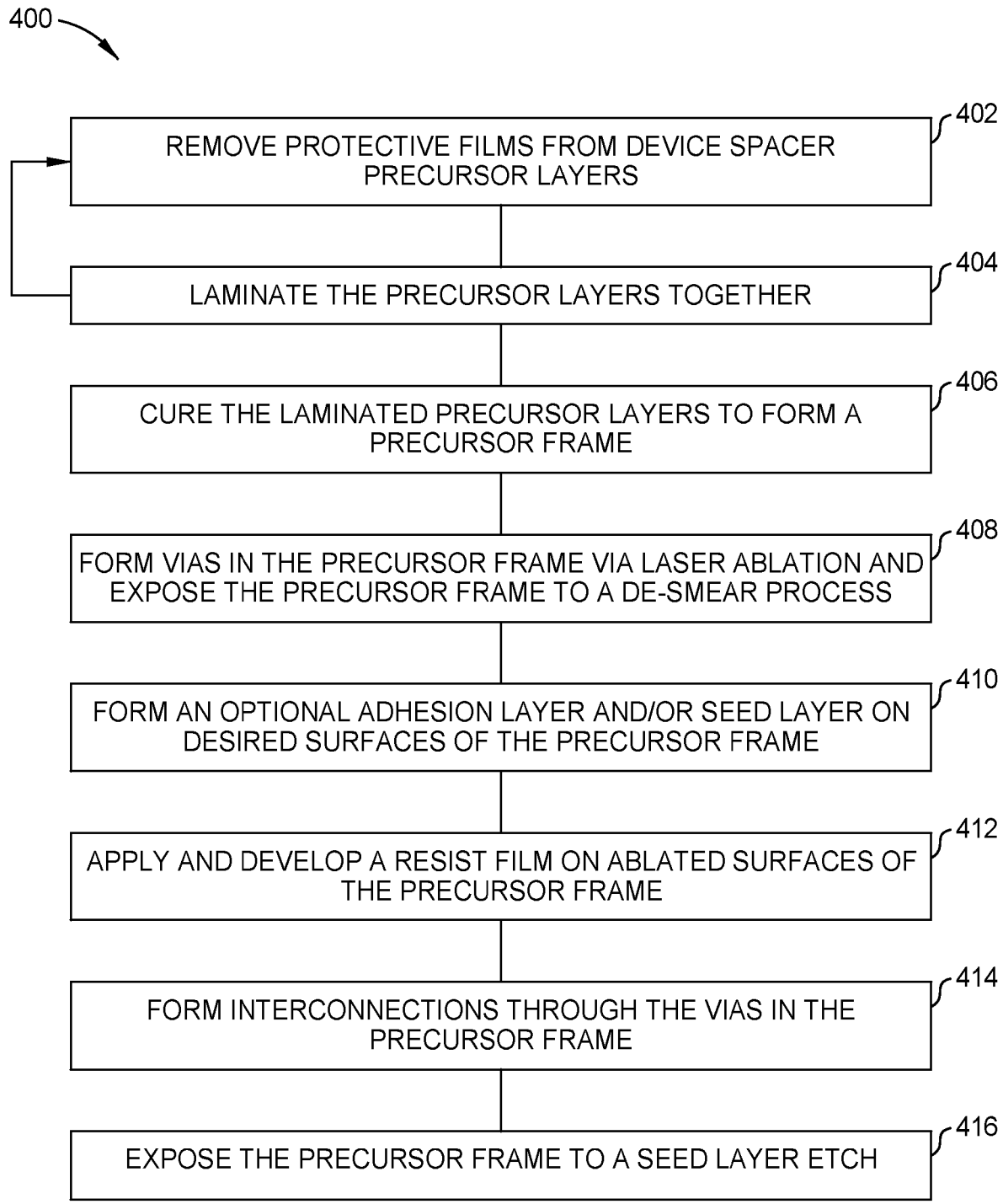
FIG. 4 is a flow diagram that illustrates a process for fabricating the semiconductor device spacers of FIGS. 1-3B, according to embodiments described herein.

FIG. 4 illustrates a flow diagram of a representative method 400 of forming a semiconductor device spacer 500. The method 400 has multiple operations 402-416 The method may include one or more additional operations which are carried out before any of the defined operations, between two of the defined operations, or after all of the defined operations (except where the context excludes the possibility). FIGS. 5A-5J schematically illustrate cross-sectional views of a semiconductor device spacer 500 at various stages of the method 400 represented in FIG. 4. Therefore, FIG. 4 and FIGS. 5A-5J are herein described together for clarity.

Figure 5A:
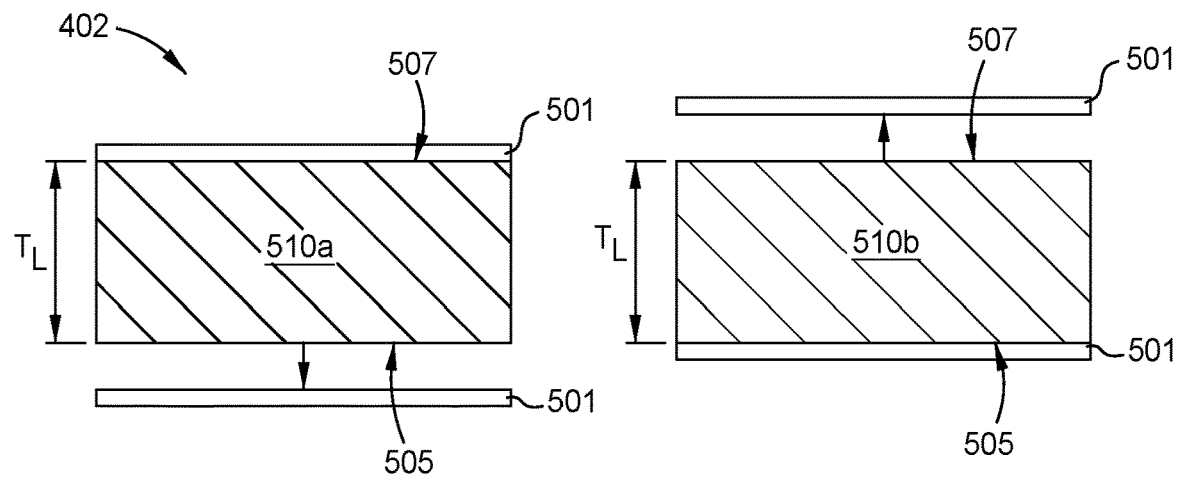
FIGS. 5A-5J schematically illustrate cross-sectional views of a semiconductor device spacer at different stages of the process depicted in FIG. 4, according to embodiments described herein.

The method 400 beings at optional operation 402 and corresponding FIG. 5A, wherein one or more protective films 501 are removed from each of two or more device spacer precursor layers 510a, 510b. The precursor layers 510a, 510b act as building blocks for formation of the frame 102 of the semiconductor device spacer 500 and thus, the precursor layers 510a, 510b are formed of a polymer-based dielectric material as described above with reference to the frame 102. For example, the precursor layers 510a, 510b are formed of flowable build-up materials. In one embodiment, the precursor layers 510a, 510b are formed of a ceramic-filler-containing epoxy resin, such as an epoxy resin filled with (e.g., containing) silica ($SiO_2$) particles. Other examples of ceramic fillers 130 that may be utilized in the precursor layers 510a, 510b include aluminum nitride (AlN), aluminum oxide ($Al_2O_3$), silicon carbide (SiC), silicon nitride ($Si_3N_4$), $Sr_2Ce_2Ti_5O_{16}$, zirconium silicate ($ZrSiO_4$), wollastonite ($CaSiO_3$), beryllium oxide (BeO), cerium dioxide ($CeO_2$), boron nitride (BN), calcium copper titanium oxide ($CaCu_3Ti_4O_{12}$), magnesium oxide (MgO), titanium dioxide ($TiO_2$), zinc oxide (ZnO) and the like. Generally, each precursor layer 510a, 510b has a thickness TL less than about 150 μm, such as a thickness TL between about 10 μm and about 150 μm, such as between about 25 μm and about 125 μm, for example between about 50 μm and about 100 μm. Any suitable amount of precursor layers 510a, 510b may utilized during the method 400 to form a semiconductor device spacer 100 having any desired dimensions.

In some embodiments, each precursor layer 510a, 510b is coupled to one or more protective films 501 that are configured to protect the precursor layers 510a, 510b during handling and storage thereof. Thus, at operation 402, the one or more protective films 501 are removed from each precursor layer 510a, 510b to expose one or more major surfaces of each precursor layer 510. As depicted in FIG. 5A, a single protective film 501 is removed from each of the two precursor layers 510a, 510b to expose surfaces 505, 507 thereof for coupling of the precursor layers 510a, 510b at operation 404.

Figure 5B:
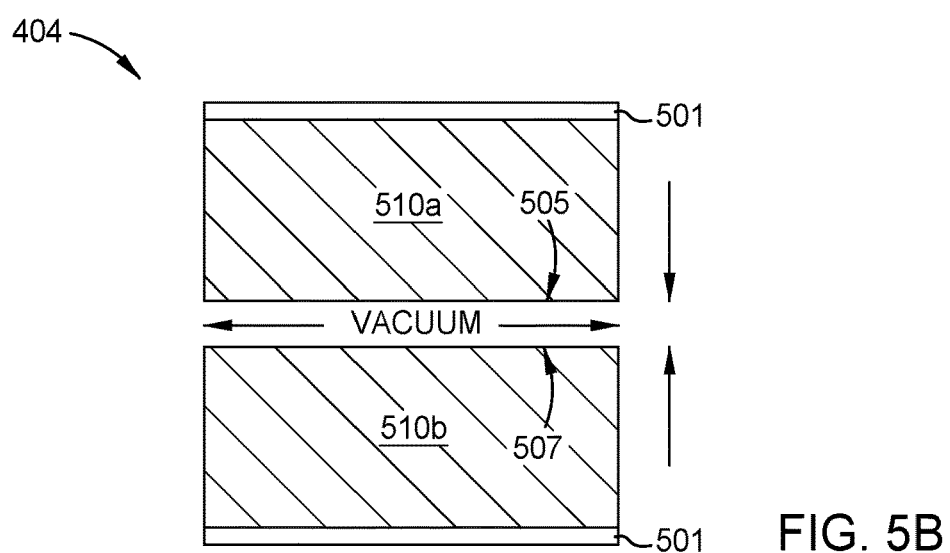
Figure 5C:
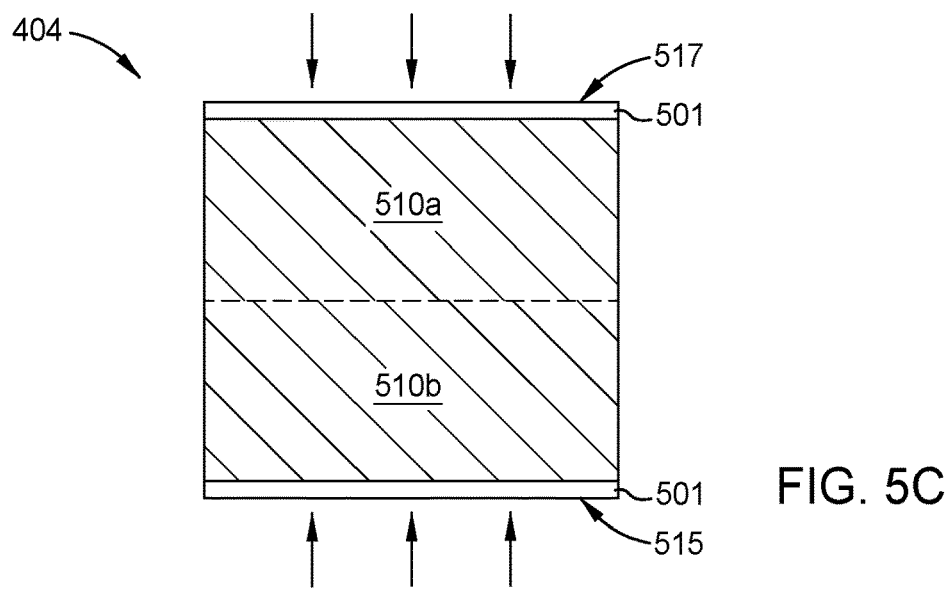

At operation 404, the one or more precursor layers 510 are coupled together (e.g., placed against one another) at the exposed surfaces thereof and laminated. Coupling and lamination of the surfaces 505, 507 of the precursor layers 510a, 510b is depicted in FIGS. 5B and 5C. Upon placement of the precursor layers 510a, 510b together, a vacuum pressure is applied to draw out any air captured between the major surfaces 505, 507 during the coupling thereof, as shown in FIG. 5B. Accordingly, at least a portion of operation 404 may be carried out in a vacuum laminator or vacuum bonder or any other suitable vessel for application of vacuum pressure. In one embodiment, the vacuum pressure is ramped up to about 1 hPa or less during an interval (e.g., time period) between about 10 seconds and about 90 seconds, such as an interval between about 30 seconds and about 60 seconds, such as an interval of about 45 seconds. Upon reaching a desired vacuum pressure level, the vacuum pressure may be maintained for an interval between about 50 seconds and 300 seconds, such as an interval between about 100 seconds and 200 seconds. In one example, the vacuum pressure is maintained at about 1 hPa or less for an interval of about 150 seconds to ensure removal of any air gaps between the precursor layers 510. During the application of vacuum pressure, the temperature is maintained within a range between about 60° C. and about 100° C., such as between about 70° C. and about 90° C. For example, the temperature is maintained at about 80° C. during the application of vacuum pressure at operation 404.

In FIG. 5C, the coupled precursor layers 510a, 510b are fused (e.g., laminated) together by application of pressure upon one or more outer surfaces of the precursor layers 510a, 510b. In one embodiment, a single-sided pressure is applied to the coupled precursor layers 510a, 510b as the coupled precursor layers 510a, 510b are supported upon a supporting diaphragm or platen (e.g., platform) (not shown).

For example, pressure may be applied to a single side 517 of the coupled precursor layers 510a, 510b as the coupled precursor layers 510a, 510b are supported by a platen on an opposing side 515. In other embodiments, a double-sided pressure is applied to the coupled precursor layers 510a, 510b. For example, pressure is applied to both sides 515, 517 by mechanical devices, such as a mechanical press or vice, or by pneumatic devices, such as pneumatic devices using compressed air. In some embodiments, lamination of the precursor layers 510a, 510b is carried out in the same vessel as the application of vacuum depicted in FIG. 5B. For example, lamination is carried out in a vacuum laminator or vacuum bonder.

During the lamination of the precursor layers 510a, 510b, a temperature is maintained within a range between about 50° C. and about 150° C., such as between about 75° C. and about 125° C., such as about 100° C. Exposing the precursor layers 510a, 510b to elevated temperatures may soften the precursor layers 510a, 510b and promote adhesion therebetween. In some embodiments, a pressure applied to the precursor layers 510a, 510b during lamination is between about 0.3 kg/cm² and about 1 kg/cm², such as between about 0.4 kg/cm² and about 0.8 kg/cm², such as about 0.5 kg/cm² or about 0.6 kg/cm².

Figure 5D:
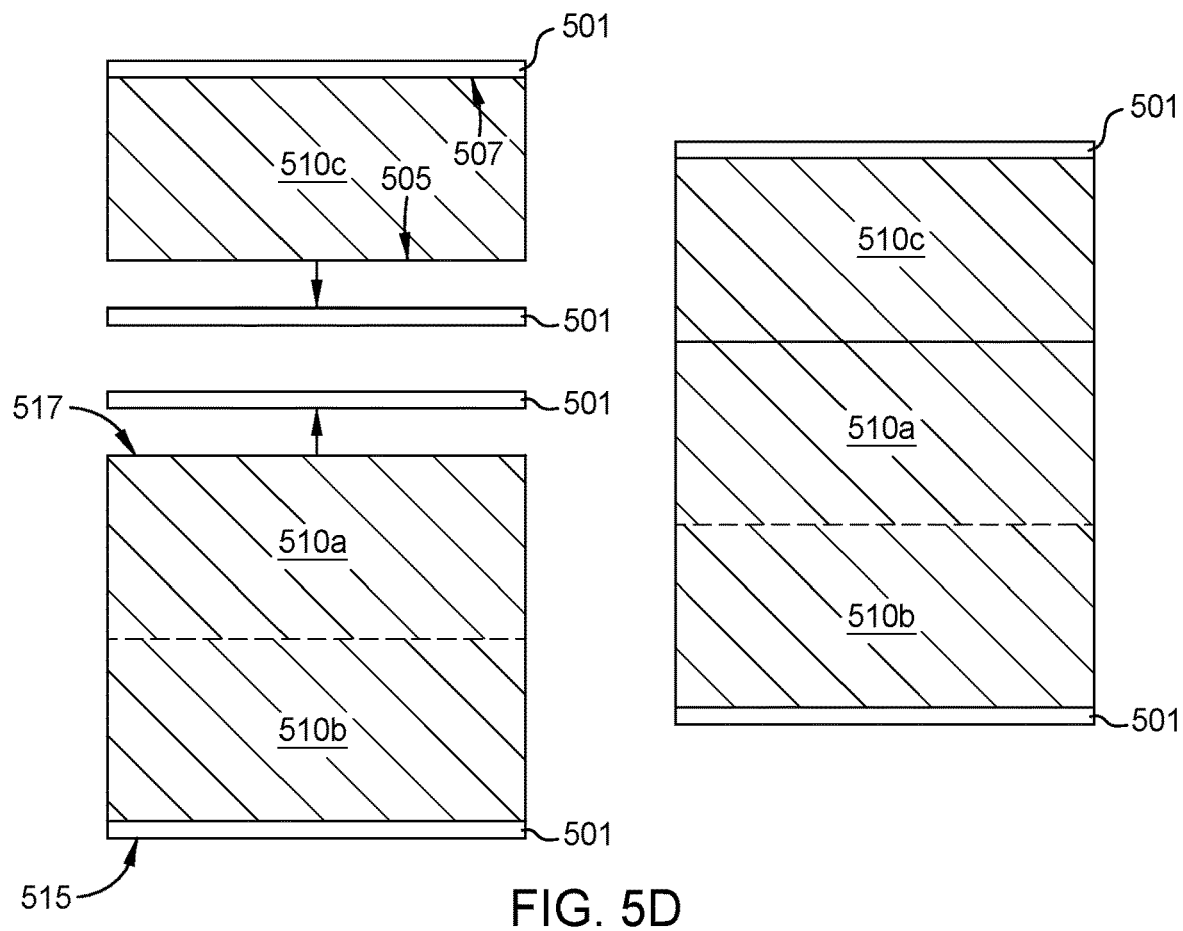
Figure 5E:
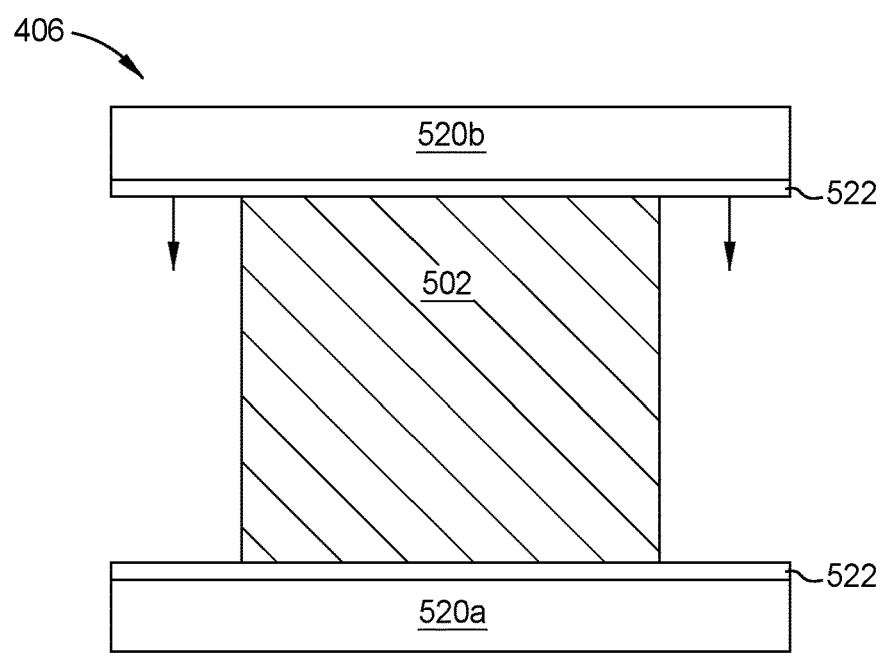

Upon completion of operation 404, the operations 402 and 404 may be repeated to couple and fuse additional precursor layers 510 to the already fused precursor layers 510a, 510b, or the fused precursor layers 510a, 510b may be exposed to a cure process at operation 406 to form a frame 502 in preparation for further structuring. For example, one or more additional precursor layers 510 may be coupled to and fused with the side 515 and/or the side 517 of the fused precursor layers 510a, 510b until a desired thickness of precursor material (corresponding to a final thickness of the frame 102) is achieved. Thus, one or more remaining protective films 501 coupled to the fused precursor layers 510a, 510b are removed therefrom in preparation for the attachment of additional precursor layers 510, in addition to any protective films 501 coupled to the additional precursor layers 510 themselves. As depicted in FIG. 5D, a single protective film 501 is removed from the side 517 of the fused precursor layers 510a, 510b in preparation for the coupling of a third precursor layer 510c thereto.

In other examples, a protective film 501 is removed from each side 515, 517 of the fused precursor layers 510a, 510b in preparation for the coupling of an additional third and fourth precursor layer (not shown) to the sides 515, 517 of the fused precursor layers 510a, 510b. Thus, the number of protective films 501 removed from the fused precursor layers 510a, 510b may be dependent upon the number of additional precursor layers 510 to be added thereto. If no additional precursor layers 510 are desired to be added to the fused precursor layers 510a, 510b and the fused precursor layers 510a, 510b are ready for curing, one or more protective films 501 coupled to both sides 515, 517 may be removed before exposure of the fused precursor layers 510a, 510b to the cure process at operation 406 depicted in FIG. 5E.

At operation 406, the fused precursor layers 510a, 510b are exposed to the cure process to partially or fully cure (i.e., harden through chemical reactions and cross-linking) the polymer-based dielectric material of the fused precursor layers 510a, 510b and form the frame 502. In some embodiments, the cure process is performed at high temperatures to fully cure the frame 502. In further embodiments, the cure process is performed at or near ambient (e.g., atmospheric) pressure conditions. During the cure process, the fused precursor layers 510a, 510b are placed on a first platen 520a within a vacuum oven, vacuum bonder, vacuum laminator or any other suitable vessel for application of vacuum pressure. The first platen 520a includes an anti-stick layer 522 disposed on a side thereof that is configured to contact and support the fused precursor layers 510a, 510b during curing. The anti-stick layer 522 is formed of any suitable non-stick materials having a low roughness value such as Teflon, PDMS, polyimide, fluorinated ethylene propylene, and the like.

Upon placement of the fused precursor layers 510a, 510b on the first platen 520a, a temperature and pressure within the vacuum chamber is ramped up to a first curing pressure of about 0.001 hPa and a first curing temperature of about 110° C. For example, the first curing pressure within the vacuum chamber is ramped up to between about 0.001 hPa and about 10 hPa, such as between about 0.001 hPa and about 1 hPa. In one example, the first curing temperature within the vacuum chamber is ramped up to between about 60° C. and about 110° C., such as between about 100° C. and about 110° C. Ramping of the temperature and/or the pressure within the vacuum chamber may be carried out over an interval between about 15 minutes and about 45 minutes, such as an interval between about 20 minutes and about 40 minutes. In one example, the temperature and/or pressure are ramped up over an interval of about 30 minutes upon placement of the fused precursor layers 510a, 510b on the first platen 520a.

Upon reaching a desired first curing temperature and/or first curing pressure within the vacuum chamber, a second platen 520b is pressed against a side of the fused precursor layers 510a, 510b opposite the first platen 520a to clamp or secure the fused precursor layers 510a, 510b in place. Similar to the first platen 520a, the second platen 520b also includes an anti-stick layer 522 disposed on a side thereof that is configured to contact the fused precursor layers 510a, 510b. Once the fused precursor layers 510a, 510b are secured between the two platens 520a, 520b, the fused precursor layers 510a, 510b are held in place for an interval between about 45 minutes and about 75 minutes and at the first curing temperature and first curing pressure. For example, the fused precursor layers 510a, 510b may be held between the two platens 520a, 520b at a temperature of about 110° C. and a pressure of about 0.01 MPa for a period of about 60 minutes.

In some embodiments, after holding the fused precursor layers 510a, 510b between the two platens 520a, 520b for a desired amount of time at the first curing temperature and the first curing pressure, the first curing temperature is again ramped up to a second curing temperature while the first curing pressure is maintained. For example, the first curing temperature is ramped up again to a second curing temperature between about 150° C. and about 180° C., such as between about 170° C. and about 180° C. In one example, the second curing temperature is about 180° C. The fused precursor layers 510a, 510b may then be held between the two platens 520a, 520b at the second curing temperature and the first curing pressure for an interval between about 15 minutes and about 45 minutes, such as between 20 minutes and about 40 minutes, such as about 30 minutes. After exposing the fused precursor layers 510a, 510b to the second curing temperature, the curing process may be completed and the cured frame 502 is cooled and removed from the platens 520a, 520b.

Figure 5F:
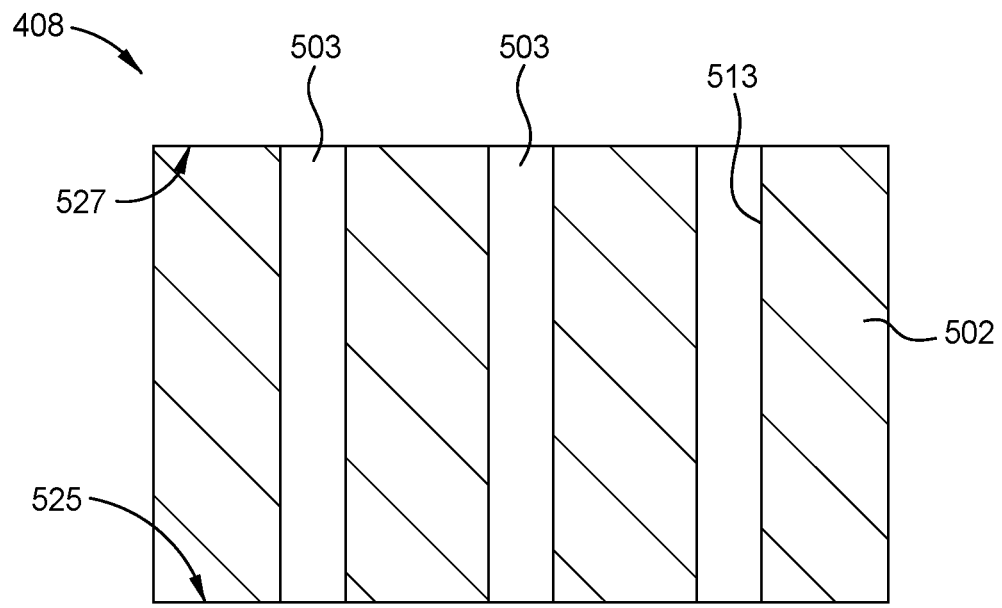
Figure 5G:
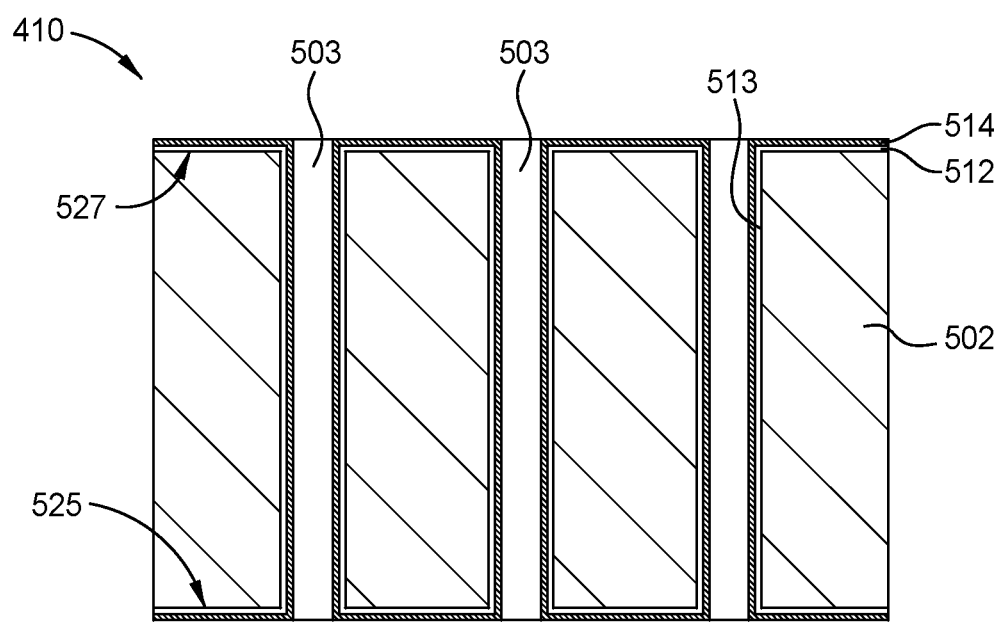

At operation 408 and FIG. 5F, the cured frame 502 is exposed to a laser ablation process (e.g., direct laser patterning) to form one or more vias 503 therein. Any suitable laser ablation system may be utilized to form the one or more vias 503. In some examples, the laser ablation system utilizes an infrared (IR) laser source. In some examples, the laser source is a nanosecond or picosecond ultraviolet (UV) laser. In other examples, the laser is a femtosecond UV laser. In still other examples, the laser source is a femtosecond green laser.

The laser source of the laser ablation system generates a continuous or pulsed laser beam for patterning of the frame 502. For example, the laser source generates a pulsed laser beam having a frequency between 5 kHz and 1000 kHz, such as between 10 kHz and about 200 kHz, such as between 15 kHz and about 100 kHz. In one embodiment, the laser source is configured to deliver a pulsed laser beam at a wavelength between about 200 nm and about 1200 nm and a pulse duration between about 10 ns and about 5000 ns with an output power between about 10 Watts and about 100 Watts. In one embodiment, the laser source is configured to deliver a pulsed laser beam at fluctuating time intervals. For example, the laser source delivers one or more rounds of pulses having between about 1 pulse and about 20 pulses with time delays therebetween. Pulse-timing fluctuations may reduce the overall thermal impact of the laser beam on the formation of the vias 503 and any other features in the frame 502. Generally, the laser source is configured to form any desired pattern of vias 503 in the frame 502, such as individual vias 503 or arrays of vias 503.

In some embodiments, the vias 503 are formed having substantially uniform diameters throughout lengths thereof (for example, between a first surface 424 and a second surface 527 of the frame 502). The vias 503 of uniform diameters may be formed by first piercing a hole into the frame 502 with a laser beam generated by the laser source and then moving the laser beam in a spiraling (e.g., circular, corkscrew) motion relative to the central axis of each of the vias 503. The laser beam may also be angled using a motion system to form the uniform vias 503. In other embodiments, the vias 503 are formed having a tapering diameters throughout lengths thereof. The tapering of vias 503 may be formed by using the same method described above, or by pulsing the laser beam generated by the laser source at a single location in the frame 502 continuously.

After formation of the vias 503, the cured and patterned frame 502 is exposed to a de-smear process. During the de-smear process, any unwanted residues and/or debris caused by laser ablation during the formation of the vias 503 are removed therefrom. The de-smear process thus cleans the vias 503 for subsequent metallization. In one embodiment, the de-smear process is a wet de-smear process. Any suitable solvents, etchants, and/or combinations thereof are utilized for the wet de-smear process. In one example, methanol is utilized as a solvent and copper (II) chloride dihydrate ($CuCl_2 \cdot H_2O$) as an etchant. Depending on the residue thickness, exposure duration of the frame 502 to the wet de-smear process is varied. In another embodiment, the de-smear process is a dry de-smear process. For example, the de-smear process is a plasma de-smear process with an $O_2/CF_4$ mixture gas. The plasma de-smear process may include generating a plasma by applying a power of about 700 W and flowing $O_2:CF_4$ at a ratio of about 10:1 (e.g., 100:10 sccm) for a time period between about 60 seconds and about 120 seconds. In further embodiments, the de-smear process is a combination of wet and dry processes.

Following the de-smear process, the frame 502 is ready for formation of conductive interconnections therein. At optional operation 410 and corresponding FIG. 5G, an adhesion layer 512 and/or a seed layer 514 are formed on the frame 502. The adhesion layer 512 is formed on desired surfaces of the frame 502, such as surfaces 525, 527 as well as sidewalls 513 of the vias 503, to assist in promoting adhesion and blocking diffusion of the subsequently formed seed layer 514 and electrical interconnections 504. Thus, in one embodiment, the adhesion layer 512 acts as an adhesion layer; in another embodiment, the adhesion layer 512 acts as a barrier layer. In both embodiments, however, the adhesion layer 512 will be described as an "adhesion layer."

In one embodiment, the adhesion layer 512 is formed of titanium, titanium nitride, tantalum, tantalum nitride, manganese, manganese oxide, molybdenum, cobalt oxide, cobalt nitride, silicon nitride, or any other suitable materials or combinations thereof. In one embodiment, the adhesion layer 512 has a thickness between about 10 nm and about 300 nm, such as between about 50 nm and about 150 nm. For example, the adhesion layer 512 has a thickness between about 75 nm and about 125 nm, such as about 100 nm. The adhesion layer 512 is formed by any suitable deposition process, including but not limited to chemical vapor deposition (CVD), physical vapor deposition (PVD), plasma enhanced CVD (PECVD), atomic layer deposition (ALD), or the like.

The seed layer 514 may be formed on the adhesion layer 512 or directly on the frame 502 (e.g., without the formation of the adhesion layer 512). In some embodiments, the seed layer 514 is formed on all surfaces of the frame 502 while the adhesion layer 512 is only formed on desired surfaces or desired portions of surfaces of the frame 502. For example, the adhesion layer 512 is formed on the surfaces 525, 527 and not on the sidewalls 513 of the vias 503 while the seed layer 514 is formed on the surfaces 525, 527 as well as sidewalls 513 of the vias 503. The seed layer 514 is formed of a conductive material such as copper, tungsten, aluminum, silver, gold, or any other suitable materials or combinations thereof. In one embodiment, the seed layer 514 has a thickness between about 0.05 µm and about 0.5 µm, such as a thickness between about 0.1 µm and about 0.3 µm. For example, the seed layer 514 has a thickness between about 0.15 µm and about 0.25 µm, such as about 0.2 µm. In one embodiment, the seed layer 514 has a thickness between about 0.1 µm and about 1.5 µm.

Similar to the adhesion layer 512, the seed layer 514 is formed by any suitable deposition process, such as CVD, PVD, PECVD, ALD dry processes, wet electroless plating processes, or the like. In one embodiment, a copper seed layer 514 is formed on a molybdenum adhesion layer 512 on the frame 502. The molybdenum adhesion and copper seed layer combination enables improved adhesion with the surfaces of the frame 502 and reduces undercut of conductive interconnect lines during a subsequent seed layer etch process.

Figure 5H:
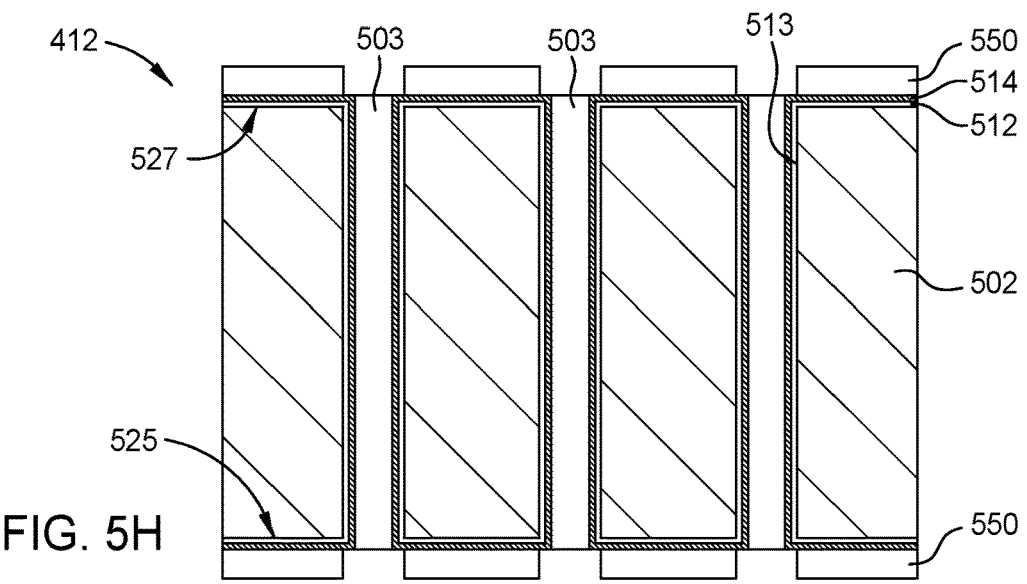

At operation 412, corresponding to FIG. 5H, a spin-on/spray-on or dry resist film 550, such as a photoresist, is applied over surfaces 525, 527 of the frame 502 and subsequently patterned. In one embodiment, the resist film 550 is patterned via selective exposure to UV radiation. In one embodiment, an adhesion promoter (not shown) is applied to the frame 502 prior to formation of the resist film 550. The adhesion promoter improves adhesion of the resist film 550 to the frame 502 by producing an interfacial bonding layer for the resist film 550 and by removing any moisture from the surface of the frame 502. In some embodiments, the adhesion promoter is formed of bis(trimethylsilyl)amine or hexamethyldisilazane (HMDS) and propylene glycol monomethyl ether acetate (PGMEA).

Upon application of the resist film 550, the frame 502 is exposed to a resist film development process. The development of the resist film 550 results in exposure of the vias 503 (shown in FIG. 5H), which may now have an adhesion layer 512 and/or a seed layer 514 formed thereon. In one embodiment, the film development process is a wet process, such as a wet process that includes exposing the resist film 550 to a solvent. In one embodiment, the film development process is a wet etch process utilizing an aqueous etch process. For example, the film development process is a wet etch process utilizing a buffered etch process selective for a desired material. Any suitable wet solvents or combination of wet etchants are used for the resist film development process.

Figure 5I:
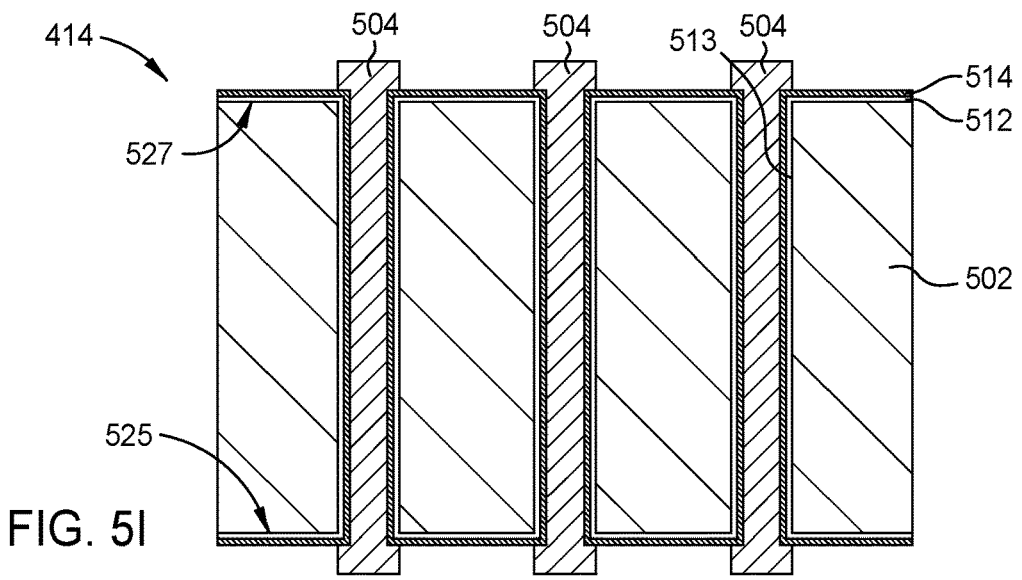

At operation 414 and FIG. 5I, electrical interconnections 504 are formed through the exposed vias 503 and the resist film 550 is thereafter removed. The interconnections 504 are formed by any suitable methods, including electroplating and electroless plating. In one embodiment, the resist film 550 is removed via a wet process. As depicted in FIG. 5I, the electrical interconnections 504 completely fill the vias 503 and protrude from the surfaces 525, 527 of the frame 502 upon removal of the resist film 550. In some embodiments, the electrical interconnections 504 only line the sidewalls 513 of the vias 503 without completely filling the vias 503. In one embodiment, the electrical interconnections 504 are formed of copper. In other embodiments, the electrical interconnections 504 are formed of any suitable conductive material including but not limited to aluminum, gold, nickel, silver, palladium, tin, or the like.

Figure 5J:
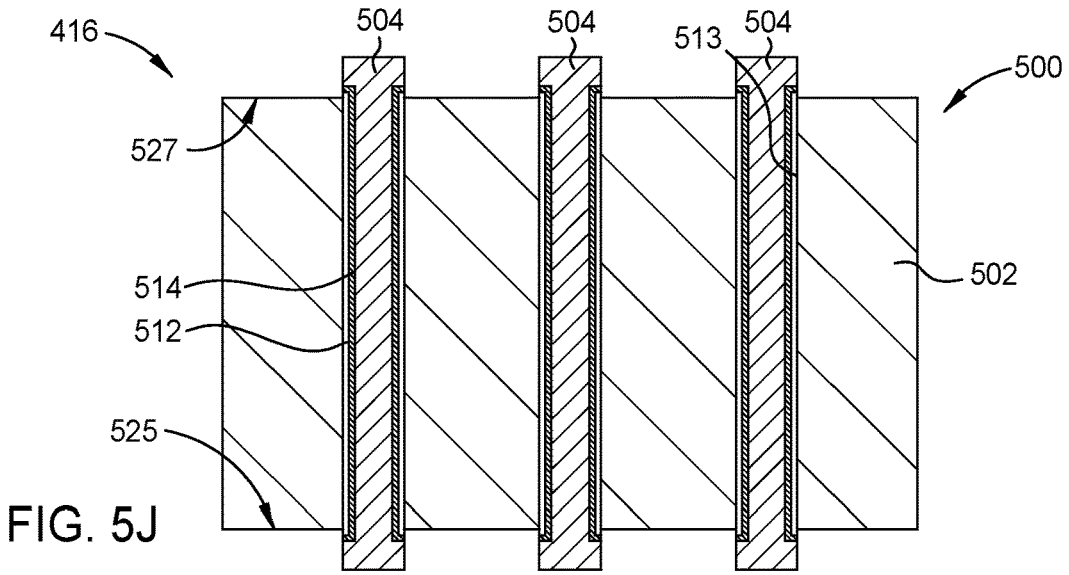
Figure 6:
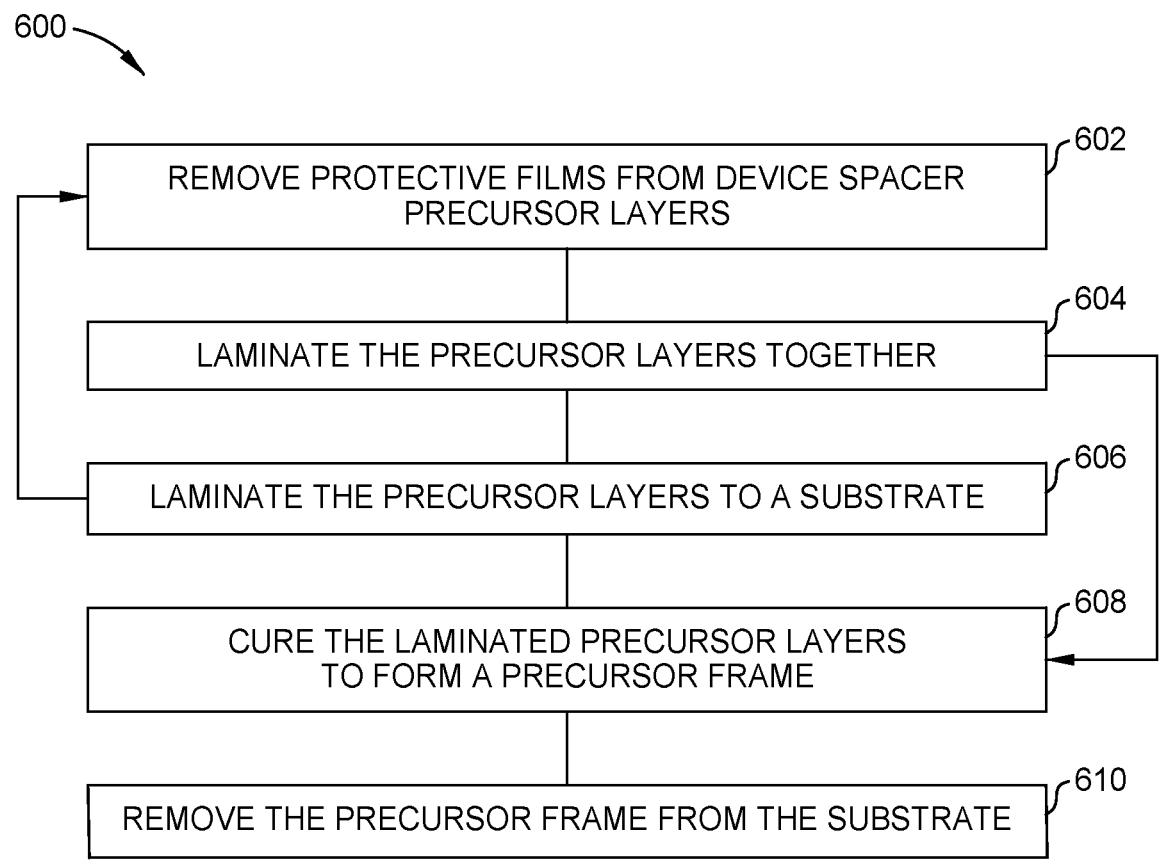
FIG. 6 is a flow diagram that illustrates a process for fabricating a frame for utilization in a semiconductor device spacer, according to embodiments described herein.

At operation 416 and FIG. 5J, the frame 502 having electrical interconnections 504 formed therein is exposed to a seed layer etch process to remove the exposed adhesion layer 512 and/or seed layer 514 on external surfaces thereof (e.g., surfaces 525, 527). Upon completion of the seed layer etch process at operation 416, the frame 502 is ready to be utilized as a semiconductor device spacer 500. In some embodiments, the adhesion layer 512 and/or seed layer 514 formed between the electrical interconnections 504 and the sidewalls 513 of the vias 503 remain after the seed layer etch process. In one embodiment, the seed layer etch is a wet etch process including a rinse and drying of the frame 502. In one embodiment, the seed layer etch process is a buffered etch process selective for a desired material such as copper, tungsten, aluminum, silver, or gold. In other embodiments, the etch process is an aqueous etch process. Any suitable wet etchant or combination of wet etchants are used for the seed layer etch process.

As discussed above, FIG. 4 and FIGS. 5A-5J illustrate a representative method 400 for forming a semiconductor device spacer 500. FIG. 6 and FIGS. 7A-7E illustrate an alternative method 600 for forming the frame 502 at operation 406. The method 600 generally includes five operations 602-610, and optional operation 602 (corresponding to FIG. 7A) is substantially similar to operation 402 of the method 400. Thus, method 600 will be described starting with operation 604 for clarity.

Figure 7A:
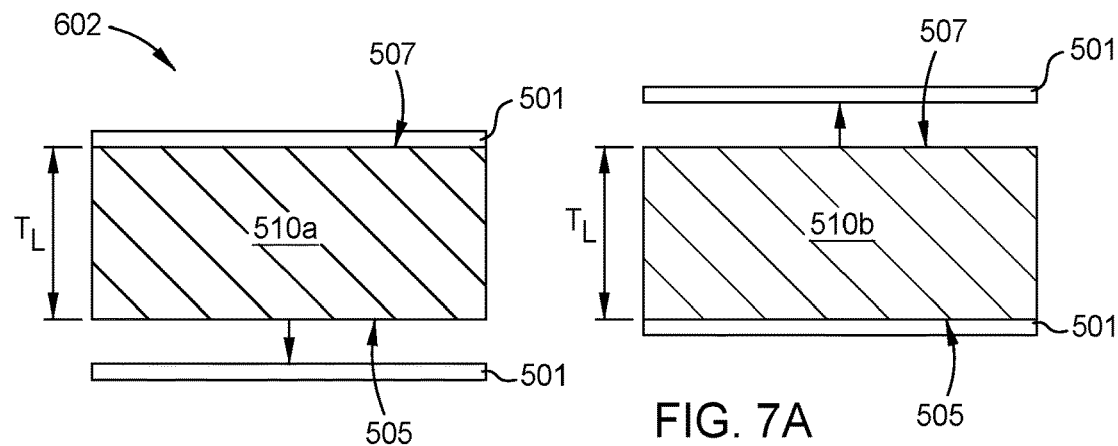
FIGS. 7A-7E schematically illustrate cross-sectional views of a frame at different stages of the process depicted in FIG. 6, according to embodiments described herein.
Figure 7B:
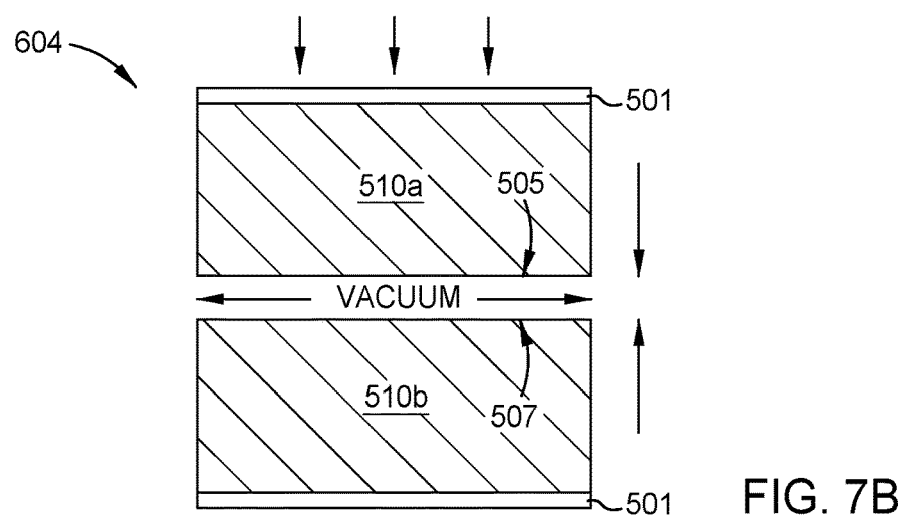

Accordingly, after peeling of protective films 501 from the precursor layers 510*a*, 510*b*, the precursor layers 510*a*, 510*b* are laminated together at operation 604 and FIG. 7B. Similar to operation 404, the precursor layers 510*a*, 510*b* are placed against one another at exposed surfaces 505, 507 thereof, after which a vacuum pressure is applied to draw out any air captured between the coupled surfaces 505, 507. In one embodiment, the precursor films 510*a*, 510*b* are exposed to a vacuum pressure between about 0.001 hPa and about 100 hPa. For example, the precursor films 510*a*, 510*b* are exposed to a vacuum pressure between about 0.001 hPa and about 10 hPa, such as a vacuum pressure between about 0.001 hPa and about 1 hPa. The vacuum pressure is applied for an interval between about 10 seconds and about 60 seconds, such as an interval between about 15 seconds and about 45 seconds, such as about 30 seconds. During application of vacuum pressure, the temperature is maintained within a range between about 60° C. and about 100° C., such as between about 70° C. and about 90° C., such as about 80° C.

After exposing the precursor films 510*a*, 510*b* to a vacuum pressure, the precursor films 510*a*, 510*b* are laminated together by application of a positive pressure to one of more outer surfaces of the precursor layers 510*a*, 510*b*. As described above, the applied pressure may be single-sided or double-sided and applied by mechanical or pneumatic processes. In one embodiment, a pressure between about 0.3 and about 1 kg/cm² is applied to one or more outer surfaces of the precursor layers 510*a*, 510*b*. For example, the precursor films 510*a*, 510*b* are exposed to a positive pressure between about 0.3 and about 0.8 kg/cm², such as a pressure of about 0.5 kg/cm². The positive pressure is applied for an interval between about 10 seconds and about 60 seconds, such as an interval between about 15 seconds and about 45 seconds, such as about 30 seconds. During the application of positive pressure, the temperature is maintained within a range between about 60° C. and about 100° C., such as between about 70° C. and about 90° C., such as about 80° C.

Figure 7C:
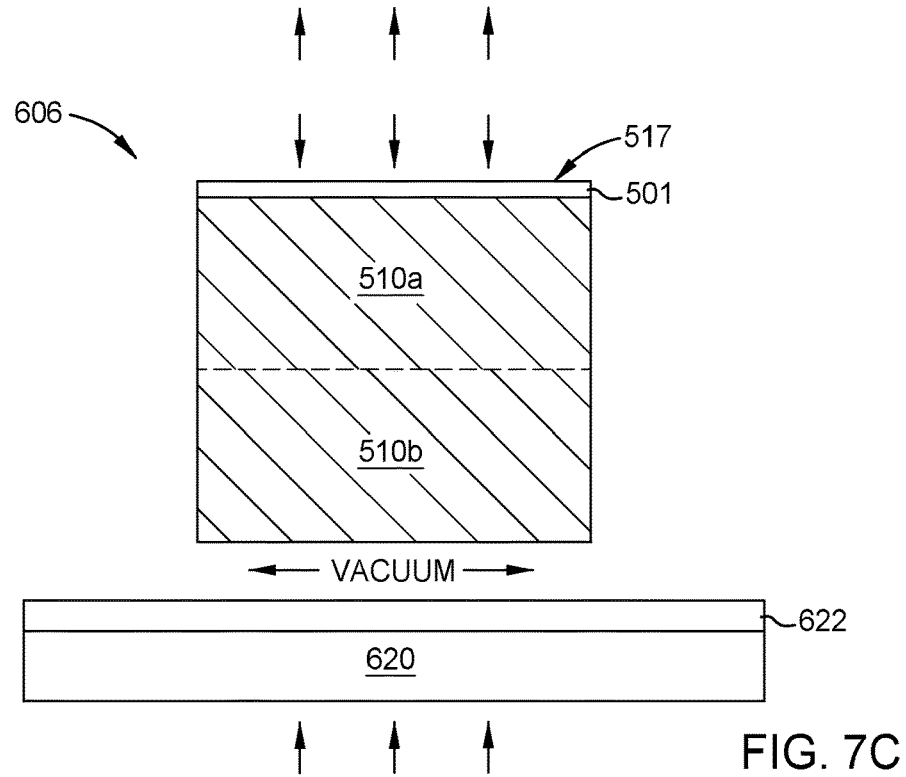

After fusing the precursor layers 510*a*, 510*b* together, the precursor layers 510*a*, 510*b* are then laminated to a substrate 620 at operation 606 and FIG. 7C. The substrate 620 is any suitable type of substrate having an anti-stick layer 622 disposed on a side thereof that is configured to contact and support the fused precursor layers 510*a*, 510*b*. In some embodiments, the substrate 620 comprises a metal or ceramic material and has a thickness between about 0.5 mm and about 1 mm. For example, the substrate 620 has a thickness between about 0.6 mm and about 0.8 mm, such as about 0.7 mm or about 0.75 mm. In some embodiments, the lateral dimensions of the substrate 620 exceed the dimensions of the precursor layers 510*a*, 510*b* such that an entire lateral area of the precursor layers 510*a*, 510*b* is supported upon the substrate 620. The anti-stick layer 622 is formed of any suitable non-stick materials having a low roughness value, such as Teflon, PDMS, polyimide, fluorinated ethylene propylene, and the like.

Similar to operation 604, lamination of the fused precursor layers 510*a*, 510*b* to the substrate 620 includes coupling the fused precursor layers 510*a*, 510*b* to the anti-stick layer 622 and exposing the precursor layers 510*a*, 510*b* and substrate 620 to vacuum followed by a positive pressure. In one embodiment, the vacuum pressure is between about 0.001 hPa and about 100 hPa. For example, the coupled precursor films 510*a*, 510*b* and substrate 620 are exposed to a vacuum pressure between about 0.001 hPa and about 10 hPa, such as a vacuum pressure between about 0.001 hPa and about 1 hPa. The vacuum pressure is applied for an interval between about 10 seconds and about 60 seconds, such as an interval between about 15 seconds and about 45 seconds, such as about 30 seconds. During application of vacuum pressure, the temperature is maintained within a range between about 60° C. and about 120° C., such as between about 70° C. and about 110° C., such as about 80° C.

After vacuum, a positive pressure is applied to one of more outer surfaces of the coupled precursor layers 510*a*, 510*b* and/or the substrate 620. In one embodiment, the positive pressure is between about 0.3 and about 1 kg/cm², such as between about 0.4 and about 0.8 kg/cm², such as a pressure of about 0.5 kg/cm². The positive pressure is applied for an interval between about 10 seconds and about 60 seconds, such as an interval between about 15 seconds and about 45 seconds, such as about 30 seconds. During the application of positive pressure, the temperature is maintained within a range between about 60° C. and about 120° C., such as between about 70° C. and about 110° C., such as about 80° C.

Figure 7D:
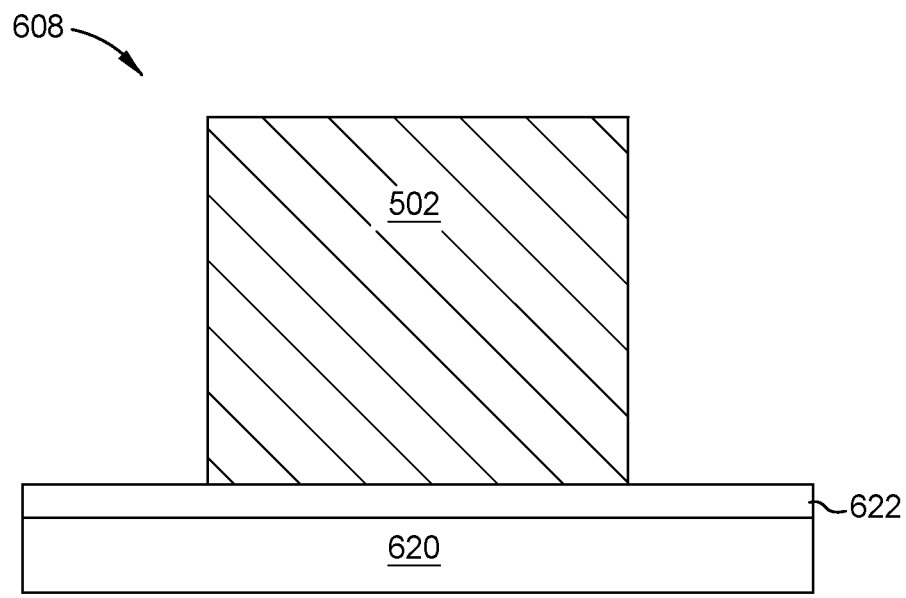
Figure 7E:
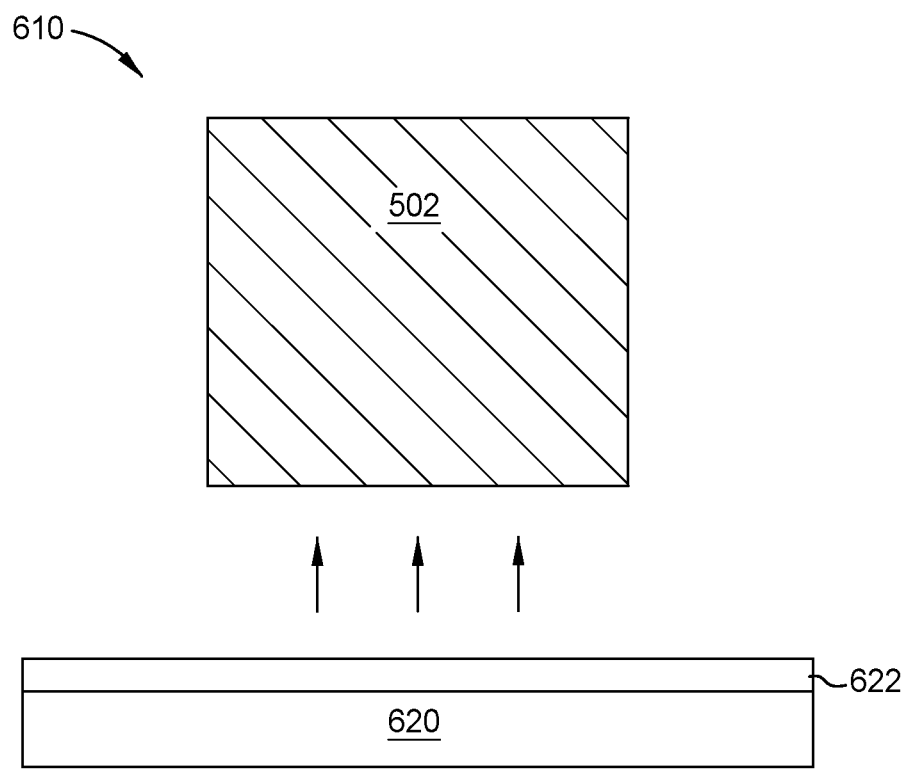

Upon completion of operation 606, the operations 602 and 604 may be repeated to couple and fuse additional precursor layers 510 to the precursor layers 510a, 510b already fused together with the substrate 620, or the precursor layers 510a, 510b may be exposed to a cure process at operation 608 and FIG. 7D to form the frame 502. Prior to the cure process, any remaining protective films 501 on the fused precursor layers 510a, 510b are removed therefrom. In one embodiment, the cure process at operation 608 includes exposing the fused precursor layers 510a, 510b and substrate 620 to a constant temperature between about 150° C. and about 200° C. for an interval between about 15 minutes and about 90 minutes. For example, the fused precursor layers 510a, 510b and the substrate 620 are exposed to a temperature of about 180° C. for an interval of about 30 minutes.

In another embodiment, the cure process includes exposing the fused precursor layers 510a, 510b and the substrate 620 to a variable temperature. For example, the fused precursor layers 510a, 510b and the substrate 620 are exposed to a first temperature between about 80° C. and about 120° C. for an interval between about 45 minutes and about 75 minutes, followed by exposure to a second temperature between about 160° C. and about 200° C. for an interval between about 15 minutes and about 45 minutes. For example, the fused precursor layers 510a, 510b and the substrate 620 are exposed to a first temperature of about 100° C. for an interval of about 60 minutes, followed by exposure to a second temperature of about 180° C. for an interval of about 30 minutes. After curing, the cured precursor frame 502 is removed from the substrate 620 for further structuring at operation 610 and FIG. 7E.

Figure 8:
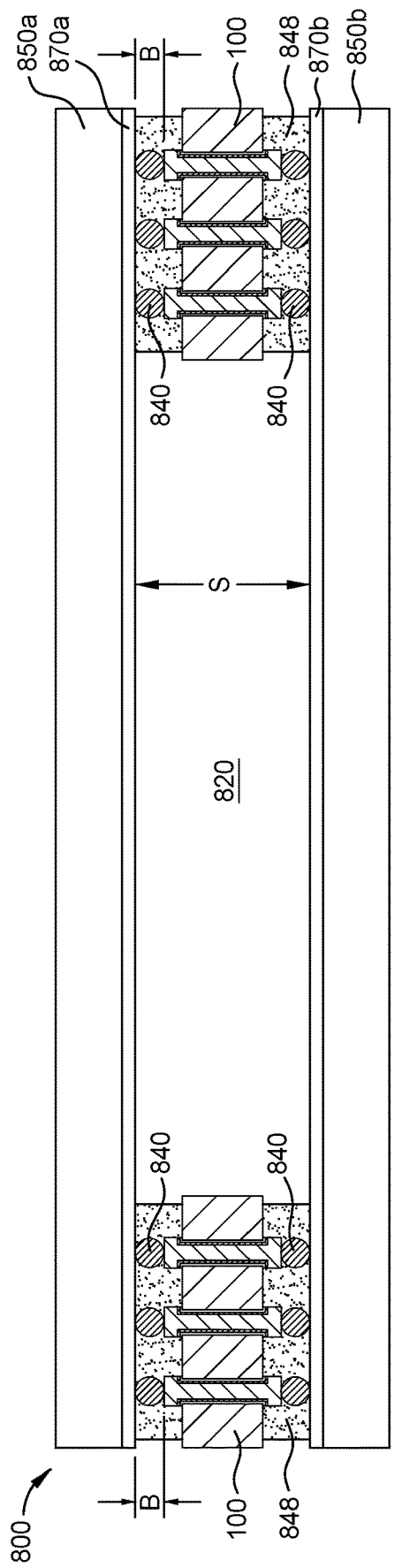
FIG. 8 schematically illustrates a cross-sectional view of a stacked semiconductor device, according to embodiments described herein.

The semiconductor device spacers 100, 500 may be utilized in any suitable stacked PCB assembly, stacked package assembly, or other suitable stacked electronic device. In one exemplary embodiment depicted in FIG. 8, two semiconductor device spacers 100 are utilized within a PCB assembly 800. As shown, the semiconductor device spacers 100 are disposed between two PCB's 850a, 850b and are configured to position the first PCB 850a relative to the second PCB 850b such that a physical space 820 remains between the first PCB's 850a, 850b while they are conductively connected through the semiconductor device spacers 100. Accordingly, the semiconductor device spacers 100 prevent the PCB's 850a, 850b from contacting one another, and thus, reduce the risk of shorting thereof. Additionally, interposition of the semiconductor device spacers 100 between the PCB's 850a, 850b may assure proper and easy placement of the PCB's 850a, 850b relative to one another, enabling proper alignment of contacts and holes therebetween. Furthermore, the interposition of the semiconductor device spacers 100 between adjacent PCB's 850a, 850b reduces the risk of overheating and burning of the PCB's 850a, 850b since the facilitation of the physical space 820 reduces the amount of heat trapped therebetween. Although only two PCBs 850a, 850b are shown in FIG. 8, it is contemplated the semiconductor device spacers 100 may be utilized to stack and interconnect two or more PCB's in parallel.

The PCB's 850a, 850b are formed of any suitable dielectric material. For example, the PCB's 850a, 850b are formed of a glass fiber reinforced epoxy resin (e.g., FR-1, FR-2, FR-4, halogen-free FR-4, high $T_g$ FR-4, and FR-5). Other suitable examples of dielectric materials include resin copper-clad (RCC), polyimide, polytetrafluoroethylene (PTFE), CEM-3, and the like. The PCB's 850a, 850b may be single-sided or double-sided circuit boards. In some embodiments, at least one of the PCB's 850a, 850b includes an electrical distribution layer 870 formed thereon and conductively connected with interconnections 104 of the semiconductor device spacers 100. For example, as depicted in FIG. 8, both PCB's 850a, 850b include electrical distribution layers 870a, 870b formed thereon and adjacent the physical space 820, respectively. The electrical distribution layers 870a, 870b are formed of any suitable conductive material such as copper, tungsten, aluminum, silver, gold, or any other suitable materials or combinations thereof. Each electrical distribution layer 870a, 870b has a thickness between about 40 µm and about 100 µm, such as a thickness between about 60 µm and about 80 µm. For example, each electrical distribution layer 870a, 870b has a thickness of about 70 µm. The electrical distribution layers 870a, 870b may have similar or different thicknesses relative to one another. Furthermore, although two electrical distribution layers 870a, 870b are depicted, each PCB 850a, 850b may have more or fewer electrical distribution layers formed on surfaces thereof. In other embodiments, the PCB's 850a, 850b include conductive pads or other suitable electrical contacts for interconnection through the semiconductor device spacers 100.

The PCB's 850a, 850b are conductively coupled to the semiconductor device spacers 100 by one or more solder bumps 840 disposed between the electrical contacts of the PCB's 850a, 850b (e.g., electrical distribution layers 870a, 870b) and the interconnections 104 of the semiconductor device spacers 100. In one embodiment, the solder bumps 840 are formed of a substantially similar material to that of the interconnections 104 and/or the electrical distribution layers 870a, 870b. For example, the solder bumps 840 are formed of a conductive material such as copper, tungsten, aluminum, silver, gold, or any other suitable materials or combinations thereof. Generally, the solder bumps 840 have a height B less than about 50 µm, such as a height B between about 5 µm and about 45 µm, such as a height B between about 10 µm and about 30 µm. For example, the solder bumps 840 have a height B about 20 µm. Altogether, the semiconductor device spacers 100 with the solder bumps 840 create the physical space 820 with a height S between about 95 µm and about 5040 µm. Generally, the physical space 820 has a height S substantially similar to a thickness of the frame 102 of the semiconductor device spacers 100.

In one embodiment, the solder bumps 840 include C4 solder bumps. In a further embodiment, the solder bumps 840 include C2 (Cu-pillar with a solder cap) solder bumps. Utilization of C2 solder bumps may enable smaller pitch lengths and improved thermal and/or electrical properties for the PCB assembly 800. The solder bumps 840 are formed by any suitable bumping processes, including but not limited to electrochemical deposition (ECD) electroplating, and metal diffusion bonding (e.g., gold to gold).

In one embodiment, voids between the semiconductor device spacers 100 and the PBC's 850a, 850b are filled with an encapsulation material 848 to enhance the reliability of the solder bumps 840 disposed therein. The encapsulation material 848 is any suitable type of encapsulant or underfill and substantially surrounds the solder bumps 840. In one example, the encapsulation material 848 includes a pre-assembly underfill material, such as a no-flow underfill (NUF) material, a nonconductive paste (NCP) material, and a nonconductive film (NCF) material. In one example, the encapsulation material 848 includes a post-assembly underfill material, such as a capillary underfill (CUF) material and a molded underfill (MUF) material. In one embodiment, the encapsulation material 848 includes a low-expansion-filler-containing resin, such as an epoxy resin filled with (e.g., containing) $SiO_2$, AlN, $Al_2O_3$, SiC, $Si_3N_4$, $Sr_2Ce_2Ti_5O_{16}$, $ZrSiO_4$, $CaSiO_3$, BeO, $CeO_2$, BN, $CaCu_3Ti_4O_{12}$, MgO, $TiO_2$, ZnO and the like.

Figure 9:
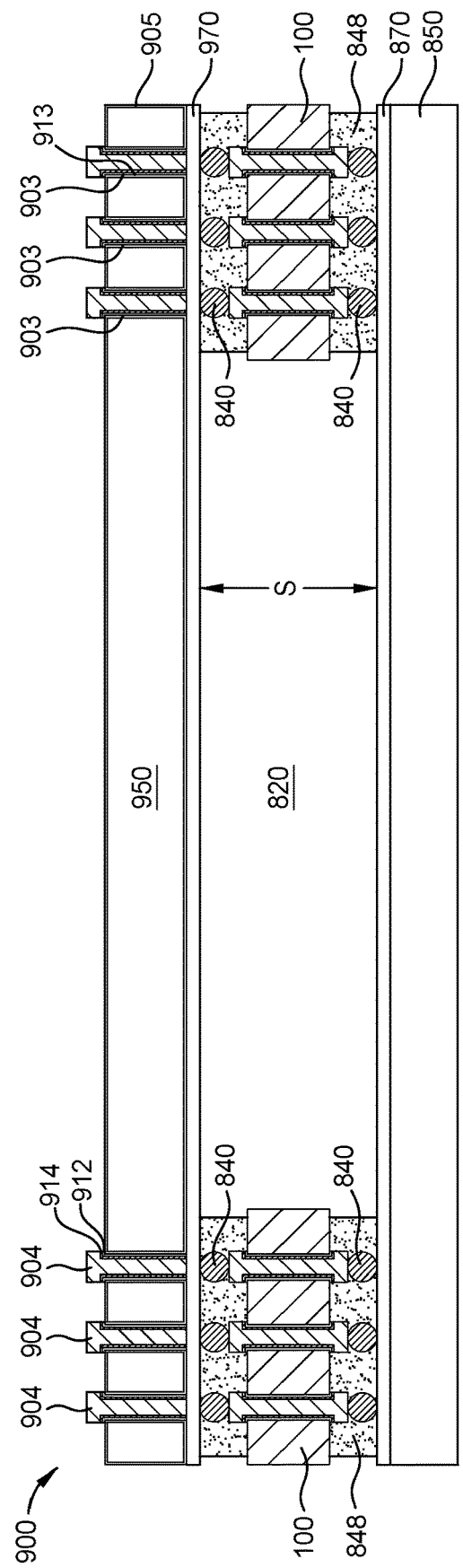
FIG. 9 schematically illustrates a cross-sectional view of a stacked semiconductor device, according to embodiments described herein.

In another exemplary embodiment depicted in FIG. 9, the semiconductor device spacers 100 are utilized in a PCB assembly 900. The PCB assembly 900 is substantially similar to PCB assembly 800, but includes a substrate 950 in place of one of the PCB's 850a, 850b described above. Thus, the semiconductor device spacers 100 may be utilized to interconnect and stack a single PCB 850 with the substrate 950. Although only a single PCB 850 and a single substrate 950 are shown in FIG. 9, it is contemplated the semiconductor device spacers 100 may be utilized to stack and interconnect any quantity and combination of PCB's 850 and/or substrates 950 in parallel. In some embodiments, two or more substrates 950 may be stacked and interconnected without the inclusion of a PCB 850.

The substrate 950 is any suitable type of substrate for use with electronic devices. In one embodiment, the substrate 950 is configured to function as a core structure for a semiconductor package, an interposer, an intermediate bridging connector, a PCB spacer, a chip carrier, or the like. Accordingly, the substrate 950 is formed of any suitable substrate material including but not limited to a III-V compound semiconductor material, silicon, crystalline silicon (e.g., Si<100> or Si<111>), silicon oxide, silicon germanium, doped or undoped silicon, doped or undoped polysilicon, silicon nitride, quartz, glass material (e.g., borosilicate glass), sapphire, alumina, and/or ceramic material. In one embodiment, the substrate 950 is a monocrystalline p-type or n-type silicon substrate. In one embodiment, the substrate 950 is a multicrystalline p-type or n-type silicon substrate. In another embodiment, the substrate 950 is a p-type or an n-type silicon solar substrate.

In further embodiments, the substrate 950 further includes an optional passivating layer 905 formed on desired surfaces thereof, such as an oxide passivating layer 905. For example, the substrate 950 may include a silicon oxide passivating layer 905 formed on substantially all surfaces thereof and thus, the passivating layer 905 substantially surrounds the substrate 950. The passivating layer 905 provides a protective outer barrier for the substrate 950 against corrosion and other forms of damage. In some examples, the passivating layer 905 has a thickness between about 100 nm and about 3 µm, such as a thickness between about 200 nm and about 2.5 µm. In one example, the passivating layer 905 has a thickness between about 300 nm and about 2 µm, such as a thickness of about 1.5 µm.

The substrate 950 may further have a polygonal or circular shape. For example, the substrate 950 includes a substantially square silicon substrate having lateral dimensions between about 140 mm and about 180 mm, with or without chamfered edges. In another example, the substrate 950 includes a circular silicon containing wafer having a diameter between about 20 mm and about 700 mm, such as between about 100 mm and about 500 mm, for example about 300 mm. Unless otherwise noted, embodiments and examples described herein are conducted on substrates 950 having a thickness between about 50 µm and about 1000 µm, such as a thickness between about 90 µm and about 780 µm. For example, the substrate 950 has a thickness between about 100 µm and about 300 µm, such as a thickness between about 110 µm and about 200 µm.

In some embodiments, the substrate 950 is a patterned substrate and includes one or more vias 903 formed therein to enable conductive electrical interconnections 904 to be routed therethrough. The vias 903 are formed as singular and isolated vias 903 through the substrate 950 or in one or more groupings or arrays, as depicted in FIG. 9. In one embodiment, a minimum pitch between each via 903 is less than about 1000 µm, such as between about 25 µm and about 200 µm. For example, the pitch between vias 903 is between about 40 µm and about 150 µm.

Generally, the one or more vias 903 are substantially cylindrical in shape. However, other suitable morphologies for the vias 903 are also contemplated. In one embodiment, the vias 903 and thus any interconnections 904 formed therein, have a diameter less than about 500 µm, such as a diameter less than about 250 µm. For example, the vias 903 and/or the interconnections 904 have a diameter between about 25 µm and about 100 µm, such as a diameter between about 30 µm and about 60 µm. In one embodiment, the vias 903 and/or the interconnections 904 have a diameter of about 40 µm.

In one embodiment, the vias 903 and/or the interconnections 904 are formed through the entire thickness of the substrate 950. For example, the vias 903 and/or the interconnections 904 have a longitudinal length corresponding to a total thickness of the substrate 950 between about 50 µm and about 1000 µm, such as a longitudinal length between about 200 µm and about 800 µm. In one example, the vias 903 and/or the interconnections 904 have a longitudinal length of between about 400 µm and about 600 µm, such as longitudinal length of about 500 µm. In another embodiment, the vias 903 and/or the interconnections 904 are only formed through a portion of the thickness of the substrate 950. In further embodiments, the interconnections 904 protrude from one or more surfaces of the substrate 950, as depicted in FIG. 9. Similar to the interconnections 104, the interconnections 904 are formed of any conductive materials used in the field of microelectronic devices, integrated circuits, circuit boards, and the like. For example, the interconnections 904 are formed of a metallic material, such as copper, aluminum, gold, nickel, silver, palladium, tin, or the like.

In some embodiments, the substrate 950 further includes an adhesion layer 912 and/or a seed layer 914 formed over desired surfaces of the substrate 950 upon which the interconnections 904 are formed. For example, the adhesion layer 912 and/or the seed layer 914 are formed on the sidewalls 913 of the vias 903. Generally, the adhesion layer 912 and/or the seed layer 914 are substantially similar in material and morphology to the adhesion layers 112, 512 and the seed layers 114, 514. In some embodiments, the adhesion layer 912 and/or the seed layer 914 are formed over the passivating layer 905, which is formed over the sidewalls 913 of the vias 903.

In some embodiments, the substrate 950 further includes one or more optional electrical distribution layers 970 disposed on desired surfaces thereof. In FIG. 9, the electrical distribution layer 970 is disposed on a surface adjacent the physical space 820, opposite the optional electrical distribution layer 870, and in contact with the interconnections 904. The electrical distribution layer 970 is formed of any suitable conductive material such as copper, tungsten, aluminum, silver, gold, or any other suitable materials or combinations thereof. In further embodiments, the substrate 950 may include conductive pads or other suitable electrical contacts for interconnection with the PCB 850 through the semiconductor device spacers 100.

Figure 10:
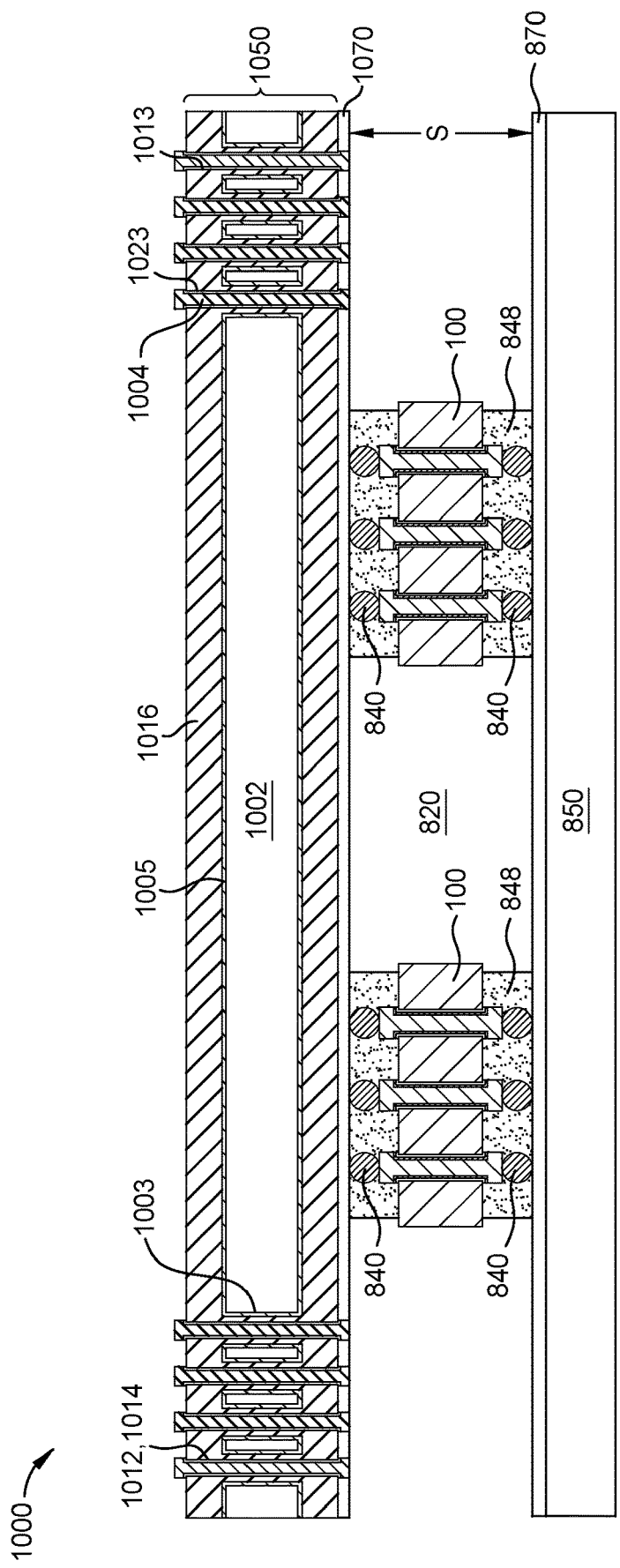
FIG. 10 schematically illustrates a cross-sectional view of a stacked semiconductor device, according to embodiments described herein.

In another exemplary embodiment depicted in FIG. 10, the semiconductor device spacers 100 are utilized in a PCB assembly 1000. The PCB assembly 1000 is substantially similar to PCB assembly 900, but includes a semiconductor core assembly 1050 in place of the substrate 950 described above. Thus, the semiconductor device spacers 100 may be utilized to interconnect and stack a single PCB 850 with the semiconductor core assembly 1050. Although only a single PCB 850 and a single semiconductor core assembly 1050 are shown in FIG. 10, it is contemplated the semiconductor device spacers 100 may be utilized to stack and interconnect any quantity and combination of PCB's 850 and/or semiconductor core assemblies 1050 in parallel. In some embodiments, two or more semiconductor core assemblies 1050 may be stacked and interconnected without the inclusion of a PCB 850.

The semiconductor core assembly 1050 may be utilized for structural support and electrical interconnection of semiconductor packages. In other examples, the semiconductor core assembly 1050 may be utilized as a carrier structure for a surface-mounted device, such as a chip or graphics card. The semiconductor core assembly 1050 generally includes a core structure 1002, an optional passivating layer 1005, and an insulating layer 1016.

In one embodiment, the core structure 1002 includes a patterned (e.g., structured) substrate formed of any suitable substrate material. For example, the core structure 1002 includes a substrate formed from any of the materials described above with reference to substrate 950. The substrate utilized to form the core structure 1002 may further have a polygonal or circular shape. For example, the core structure 1002 includes a substantially square silicon substrate having lateral dimensions between about 120 mm and about 180 mm, with or without chamfered edges. In another example, the core structure 1002 includes a circular silicon-containing wafer having a diameter between about 20 mm and about 700 mm, such as between about 100 mm and about 50 mm, for example about 300 mm. Unless otherwise noted, embodiments and examples described herein are conducted on substrates having a thickness between about 50 μm and about 1000 μm, such as a thickness between about 90 μm and about 780 μm. For example, the substrate utilized for the core structure 1002 has a thickness between about 100 μm and about 300 μm, such as a thickness between about 110 μm and about 200 μm.

Similar to the substrate 950, the core structure 1002 further includes one or more core vias 1003 formed therein to enable conductive electrical interconnections to be routed through the core structure 1002. The core vias 1003 are formed as singular and isolated core vias 1003 through the core structure 1002 or in one or more groupings or arrays. In one embodiment, a minimum pitch between each core via 1003 is less than about 1000 μm, such as between about 25 μm and about 200 μm. For example, the pitch is between about 40 μm and about 150 μm. In one embodiment, the one or more core vias 1003 have a diameter less than about 500 μm, such as a diameter less than about 250 μm. For example, the core vias 1003 have a diameter between about 25 μm and about 100 μm, such as a diameter between about 30 μm and about 60 μm. In one embodiment, the core vias 1003 have a diameter of about 40 μm.

The optional passivating layer 1005 is similar to the passivating layer 905 and is formed on one or more surfaces of the core structure 1002, including the one or more sidewalls 1013 of the core vias 1003. In one embodiment, the passivating layer 1005 is formed on substantially all exterior surfaces of the core structure 1002 such that the passivating layer 1005 substantially surrounds the core structure 1002. In one embodiment, the passivating layer 1005 is formed of an oxide film or layer, such as a thermal oxide layer. For example, the passivating layer 1005 may be a silicon oxide layer. In some examples, the passivating layer 1005 has a thickness between about 100 nm and about 3 μm, such as a thickness between about 200 nm and about 2.5 μm. In one example, the passivating layer 1005 has a thickness between about 300 nm and about 2 μm, such as a thickness of about 1.5 μm.

The insulating layer 1016 is formed on one or more surfaces of the core structure 1002 or the passivating layer 1005 and substantially encases the passivating layer 1005 and/or the core structure 1002. Thus, the insulating layer 1016 extends into the core vias 803 and coat the passivating layer 1005 formed on the sidewalls 1013 thereof or directly coat the core structure 1002. In one embodiment, the insulating layer 1016 has a thickness from an outer surface of the core structure 1002 or the passivating layer 1005 to an adjacent outer surface of the insulating layer 1016 that is less than about 50 μm, such as a thickness less than about 20 μm. For example, the insulating layer 1016 has thickness between about 5 μm and about 10 μm.

In one embodiment, the insulating layer 1016 is formed of polymer-based dielectric materials, similar to the frame 102 of semiconductor device spacers 100. For example, the insulating layer 1016 is formed from a flowable build-up material. Accordingly, although hereinafter referred to as an "insulating layer," the insulating layer 1016 may also be described as a dielectric layer. In a further embodiment, the insulating layer 1016 is formed of an epoxy resin material having a ceramic filler, such as silica ($SiO_2$) particles. Other examples of ceramic fillers that may be utilized to form the insulating layer 1016 include aluminum nitride (AlN), aluminum oxide ($Al_2O_3$), silicon carbide (SiC), silicon nitride ($Si_3N_4$), $Sr_2Ce_2Ti_5O_{16}$, zirconium silicate ($ZrSiO_4$), wollastonite ($CaSiO_3$), beryllium oxide (BeO), cerium dioxide ($CeO_2$), boron nitride (BN), calcium copper titanium oxide ($CaCu_3Ti_4O_{12}$), magnesium oxide (MgO), titanium dioxide ($TiO_2$), zinc oxide (ZnO) and the like. In some examples, the ceramic fillers utilized to form the insulating layer 1016 have particles ranging in diameter between about 40 nm and about 1.5 μm, such as between about 80 nm and about 1 μm. For example, the ceramic fillers have particles with a diameter between about 200 nm and about 800 nm, such as between about 300 nm and about 600 nm. In some embodiments, the ceramic fillers include particles having a diameter less than about 10% of the width or diameter of adjacent core vias 1003 in the core structure 1002, such as a diameter less than about 5% of the width or diameter of the core vias 1003.

One or more through-assembly vias 1023 are formed through the insulating layer 1016 where the insulating layer 1016 extends into the core vias 1003 to enable electrical interconnections 1004 to be routed therethrough. For example, the through-assembly vias 1023 are centrally formed within the core vias 1003 having the insulating layer 1016 disposed therein. Accordingly, the insulating layer 1016 forms one or more sidewalls of the through-assembly vias 1023, wherein the through-assembly vias 1023 have a diameter lesser than the diameter of the core vias 1003. In one embodiment, the through-assembly vias 1023 have a diameter less than about 100 µm, such as less than about 75 µm. For example, the through-assembly vias 1023 have a diameter less than about 50 µm, such as less than about 35 µm. In one embodiment, the through-assembly vias 1023 have a diameter of between about 25 µm and about 50 µm, such as a diameter of between about 35 µm and about 40 µm.

In one embodiment, the interconnections 1004, and thus the through-assembly vias 1023 and the core vias 1003, are formed through the entire thickness of the semiconductor core assembly 1050. For example, the interconnections 1004 and/or the through-assembly vias 1023 and/or the core vias 1003 have a longitudinal length corresponding to a total thickness of the semiconductor core assembly 1050 between about 50 µm and about 1000 µm, such as a longitudinal length between about 200 µm and about 800 µm. In one example, the interconnections 1004 and/or the through-assembly vias 1023 and/or the core vias 1003 have a longitudinal length of between about 400 µm and about 600 µm, such as longitudinal length of about 500 µm. In another embodiment, the interconnections 1004 and/or the through-assembly vias 1023 and/or the core vias 1003 are only formed through a portion of the thickness of the semiconductor core assembly 1050. In further embodiments, the interconnections 1004 protrude from one or more surfaces of the semiconductor core assembly 1050, as depicted in FIG. 10. Similar to the interconnections described above, the interconnections 1004 are formed of any conductive materials used in the field of integrated circuits, circuit boards, chip carriers, and the like. For example, the electrical interconnections 1004 are formed of a metallic material, such as copper, aluminum, gold, nickel, silver, palladium, tin, or the like.

In some embodiments, the semiconductor core assembly 1050 further includes an adhesion layer 1012 and/or a seed layer 1014 formed on desired surfaces of the insulating layer 1016 upon which the interconnections 1004 are formed. For example, the adhesion layer 1012 and/or the seed layer 1014 are formed on the sidewalls of the through-assembly vias 1003. Generally, the adhesion layer 1012 and/or the seed layer 1014 are substantially similar in material and morphology to the adhesion layers 112, 512 and the seed layers 114, 514.

In some embodiments, the semiconductor core assembly 1050 further includes one or more optional electrical distribution layers 1070 disposed on desired surfaces thereof. In FIG. 10, the electrical distribution layer 1070 is disposed on a surface adjacent the physical space 820, opposite the optional electrical distribution layer 870, and in contact with the interconnections 1004 and solder bumps 840. The electrical distribution layer 1070 are formed of any suitable conductive material such as copper, tungsten, aluminum, silver, gold, or any other suitable materials or combinations thereof. In further embodiments, the semiconductor core assembly 1050 may include conductive pads or other suitable electrical contacts for interconnection with the PCB 850 through the semiconductor device spacers 100.

Figure 11A:
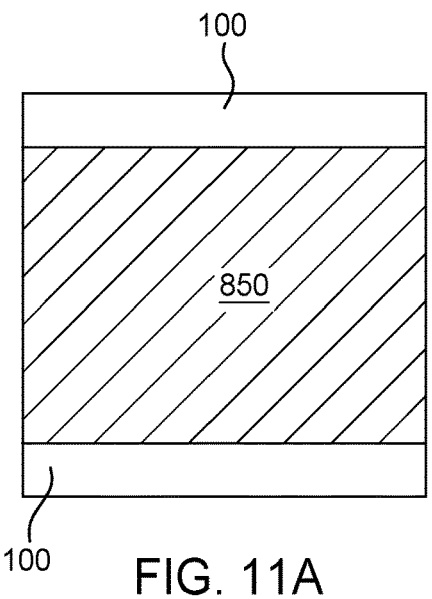
FIGS. 11A-11E schematically illustrate top views of semiconductor device spacer arrangements, according to embodiments described herein.
Figure 11C:
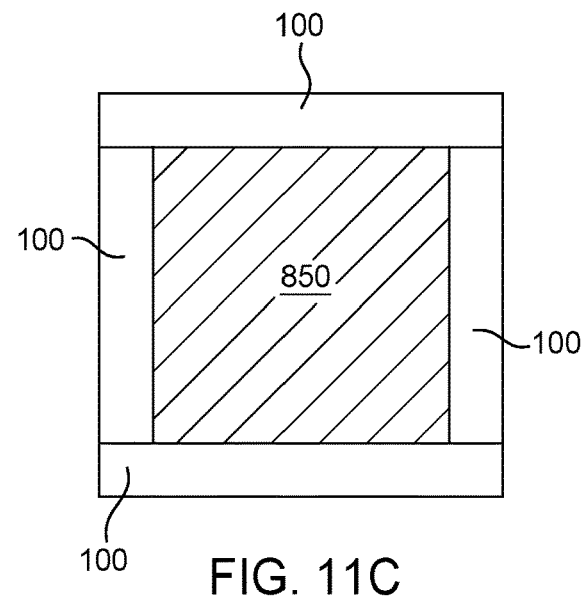
Figure 11B:
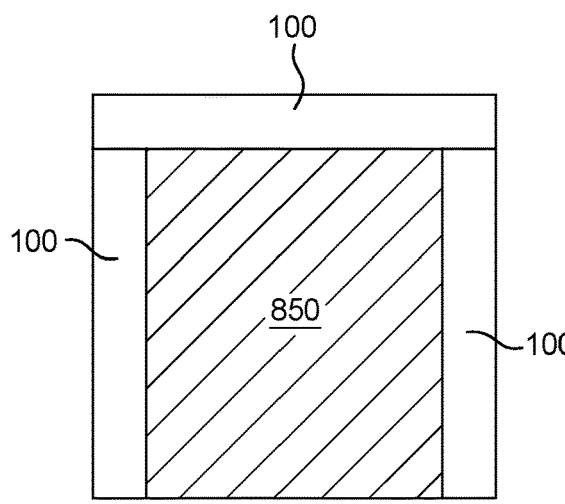
Figure 11D:
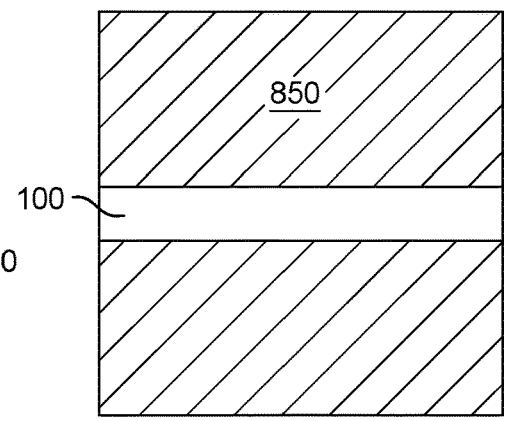

FIGS. 11A-11E schematically illustrate top views of possible arrangements of the semiconductor device spacers 100 when coupled to at least a single device, such as the PCB 850, according to the descriptions of FIGS. 8-10 above. Generally, the semiconductor device spacers 100 may be disposed between adjacent PCB's or other devices in any suitable quantity and arrangement. As depicted in FIG. 11A, two semiconductor device spacers 100 are disposed on a top surface of the PCB 850 along edges of opposing ends thereof. FIG. 11B illustrates three semiconductor device spacers 100 disposed along three edges of the top surface of PCB 850 and FIG. 11C illustrates four semiconductor device spacers 100 disposed along all four edges of the top surface of PCB 850. In an alternative example, FIG. 11D illustrates a single semiconductor device spacer 100 medially disposed along the top surface of the PCB 850 and extending from one edge to an opposing edge thereof.

Figure 11E:
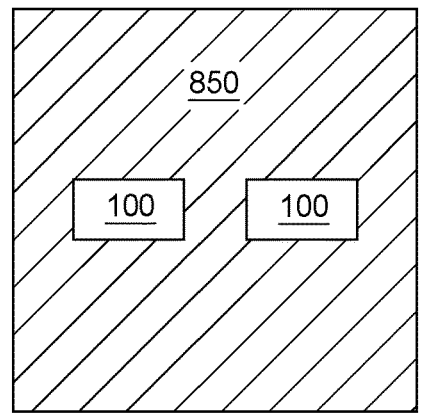

FIGS. 11A-11D depict exemplary arrangements wherein one or more semiconductor device spacers 100 have a lateral dimension spanning the length of one or more edges (e.g., sides) of an adjacent device. FIG. 11E depicts an alternative exemplary arrangement wherein one or more semiconductor device spacers 100 have dimensions less than the lengths of the sides of the adjacent device. As shown in FIG. 11E, two semiconductor device spacers 100 are medially disposed along the top surface of the PCB 850, each semiconductor device spacer 100 having a lateral dimensions substantially less than lengths of the sides of PCB 850. In some embodiments, the ratio of area of the semiconductor device spacers 100 relative to the area of the PCB 850 is between about 0.01 and about 0.99, such as between about 0.05 and about 0.95. For example, the ratio of area of the semiconductor device spacers 100 relative to the area of the PCB 850 is between about 0.1 and about 0.9, such as between about 0.15 and about 0.85.

The utilization of the semiconductor device spacers 100 in the embodiments shown above provides multiple advantages over the spacers utilized in conventional stacked package, PCB, and chip carrier structures. Such benefits include improved thermal management for improved electrical performance and reliability of stacked device architectures. The improved thermal conductivity of these spacers, as well as the ability to pattern fine features therein, further enables thin-form-factor structures with greater I/O scaling to meet the ever-increasing bandwidth and power efficiency demands of artificial intelligence (AI) and high performance computing (HPC). Additionally, the fabrication methods for the semiconductor device spacers described herein provide high performance and flexibility for 3D integration with relatively low manufacturing costs as compared to conventional spacer and stacking technologies.

While the foregoing is directed to embodiments of the present disclosure, other and further embodiments of the disclosure may be devised without departing from the basic scope thereof, and the scope thereof is determined by the claims that follow.

What is claimed is:
1. A semiconductor device assembly, comprising:
    a first printed circuit board (PCB) comprising:
        a first glass fiber reinforced epoxy resin material; and
        a first electrical distribution layer formed on the first glass fiber reinforced epoxy resin material;
    a second PCB comprising:
        a second glass fiber reinforced epoxy resin material; and
        a second electrical distribution layer formed on the second glass fiber reinforced epoxy resin material; and
    a device spacer interposed between the first PCB and the second PCB to facilitate a physical space therebetween, the device spacer further comprising:
        a frame having a first surface opposite a second surface, the frame further comprising:

a frame material comprising a polymer-based dielectric material having ceramic filler particles; and a via comprising a via surface that defines an opening extending through the frame from the first surface to the second surface, the via having a first diameter of about 10 μm and about 150 μm;

an electrical interconnection disposed within the via on the via surface to form at least part of a conductive path extending between at least a portion of the first and second electrical distribution layers; and solder bumps conductively coupling the electrical interconnection with the first and second electrical distribution layers.

2. The semiconductor device assembly of claim 1, wherein the ceramic filler particles comprise silica particles having a maximum diameter of about 0.6 μm.

3. The semiconductor device assembly of claim 2, wherein a packing density of the silica particles is between about 0.5 and about 0.95 by volume.

4. The semiconductor device assembly of claim 1, wherein the frame has a thickness between about 400 μm and about 1600 μm.

5. The semiconductor device assembly of claim 1, wherein the solder bumps have a maximum height of about 50 μm.

6. The semiconductor device assembly of claim 1, further comprising an encapsulation material substantially surrounding the solder bumps.

7. The semiconductor device assembly of claim 1, wherein a ratio of an area of the device spacer relative to an area of a surface of the first or second PCB is between about 0.15 and about 0.85.

8. The semiconductor device assembly of claim 1, further comprising a silicon substrate comprising a silicon core structure, the silicon core structure having a thickness less than 1000 μm.

9. The semiconductor device assembly of claim 8, wherein the second electrical distribution layer is formed on the silicon core structure and surrounds the silicon core structure.

10. The semiconductor device assembly of claim 1, wherein the frame further comprises a lateral dimension that is less than a lateral dimension of the first PCB and the second PCB.

11. The semiconductor device assembly of claim 1, further comprising a barrier layer lining the via surface and disposed between the via surface and the electrical interconnection.

12. The semiconductor device assembly of claim 11, wherein the barrier layer comprises molybdenum.

13. The semiconductor device assembly of claim 1, wherein the via is tapered from a second diameter to the first diameter.

14. The semiconductor device assembly of claim 13, wherein the second diameter is between about 0 μm and about 100 μm.

15. The semiconductor device assembly of claim 1, wherein the device spacer further comprises an array of vias defining openings extending through the frame from the first surface to the second surface.

16. The semiconductor device assembly of claim 15, wherein a pitch between each via of the array of vias is between about 150 μm and about 600 μm.

* * * * *